(12) United States Patent
Sato et al.

(10) Patent No.: US 6,891,314 B2
(45) Date of Patent: May 10, 2005

(54) LATTICE ARRAY-STRUCTURED PIEZOELECTRIC ACTUATOR AND METHOD FOR PRODUCING THE SAME

(75) Inventors: Junya Sato, Tokyo (JP); Yasuhiro Sasaki, Tokyo (JP)

(73) Assignee: Fuji Xerox Co., LTD, Tokyo (JP)

(*) Notice: Subject to any disclaimer, the term of this patent is extended or adjusted under 35 U.S.C. 154(b) by 397 days.

(21) Appl. No.: 10/224,577

(22) Filed: Aug. 21, 2002

(65) Prior Publication Data

US 2003/0112298 A1 Jun. 19, 2003

(30) Foreign Application Priority Data

Aug. 22, 2001 (JP) .................................. P. 2001-252103

(51) Int. Cl.[7] .............................................. H01L 41/08
(52) U.S. Cl. ...................................... 310/328; 310/331
(58) Field of Search ............................... 310/328, 331, 310/332, 334

(56) References Cited

U.S. PATENT DOCUMENTS

| 3,582,691 A | * | 6/1971 | Sonderegger et al. | ....... 310/328 |
| 4,071,785 A | * | 1/1978 | Yoshida et al. | ............. 310/331 |
| 5,296,777 A | * | 3/1994 | Mine et al. | ................... 310/334 |
| 6,142,609 A | * | 11/2000 | Aoki | ............................ 347/50 |
| 6,190,006 B1 | | 2/2001 | Kurashima et al. | |
| 6,241,346 B1 | * | 6/2001 | Takahashi | ..................... 347/70 |

FOREIGN PATENT DOCUMENTS

| JP | 4-77257 | 3/1992 |
| JP | 6-97608 | 4/1994 |
| JP | 11-300956 | 11/1999 |
| JP | 2000-200962 | 7/2000 |

* cited by examiner

Primary Examiner—Mark Budd
(74) Attorney, Agent, or Firm—Morgan, Lewis & Bockius LLP

(57) ABSTRACT

A common electrode and a signal electrode are separately formed on two major faces of each of tabular piezoelectric actuator elements arrayed on a substrate. On a flexible printed circuit board, formed are electric bonding pads, which are to be electrically connected with the substrate of the actuator elements. A semi-spherical bump including a conductive core and a conductive sealant is formed on each of pads. The actuator elements having substrate is made to face the flexible printed circuit board, and heated under pressure to thereby electrically bond the signal electrodes (at their electric bonding area) to the corresponding bumps. Thus bonded, there exists a gap around the core, and it allows the actuator area of the signal electrode to act completely free, not interfered with any other.

18 Claims, 10 Drawing Sheets

BONDING
(UNDER HEAT, PRESSURE, AND/OR VIBRATION)

INK JET

LATTICE ARRAY-STRUCTURED PIEZOELECTRIC ACTUATOR AND METHOD FOR PRODUCING THE SAME

The present disclosure relates to the subject matter contained in Japanese Patent Application No. 2001-252103 filed on Aug. 22, 2001, which are incorporated herein by reference in its entirety.

BACKGROUND OF THE INVENTION

1. Field of the Invention

The present invention relates to a lattice array-structured piezoelectric actuator having multiple piezoelectric actuator elements arrayed in a lattice pattern, in particular, to such a lattice array-structured piezoelectric actuator integrated with a flexible printed circuit board having a large number of electric signal lines, and to a method for producing the same.

2. Description of the Related Art

The recent tendency in the art of actuators is toward a high-density array structure, or that is, a matrix array structure of tabular piezoelectric actuator elements disposed on a substrate. With it, the electric signal input terminals of the circuit board terminal unit for the recent actuators are also to have a matrix array structure.

In an ordinary actuator, in general, a common electrode and a signal electrode are formed on the two major faces of each of such matrix-arrayed, multiple tabular piezoelectric actuator elements on a substrate. The common electrode is electrically connected with the substrate, and electric signals from a control circuit are applied to the tabular piezoelectric actuator elements via the substrate and via the common electrode and the signal electrode, thereby motivating the tabular piezoelectric actuator elements to move in the direction vertical to the two major faces thereof.

For electrically bonding the tabular piezoelectric actuator elements to the circuit board, heretofore employed is a method of once rearranging the conductor matrix array of tabular piezoelectric actuator elements into a one-dimensional array thereof and thereafter bonding the thus-rearranged conductor terminals to the electric signal output terminals of an external driving unit to thereby finish the intended actuator, in view of the production costs and the productivity of the method.

FIG. 19 and FIG. 20 are perspective views showing the constitution of matrix-arrayed piezoelectric actuators according to the related art, mentioned as above. FIG. 19 shows one constitutional example of such actuators in which every actuator element is electrically bonded to a circuit board in a mode of wire bonding (this is hereinafter referred to as a related art 1); and FIG. 20 shows another constitutional example thereof in which every actuator element is electrically bonded to a circuit board in a mode of screen printing (this is hereinafter referred to as a related art 2).

First described is the matrix-arrayed piezoelectric actuator of the related art 1 shown by FIG. 19. As illustrated, this has tabular piezoelectric actuator elements 101, a substrate 102, printed circuit boards 103, and wires 104. On both the two major faces of each of the matrix-arrayed tabular piezoelectric actuator elements 101 on the substrate 102, formed is a thin electrode film, and one of the two major faces thereof is bonded to the substrate 102. Every wire 104 is bonded to any of the printed circuit boards 103, and to the thin electrode film formed one major face of each tabular piezoelectric actuator element 101. The printed circuit boards 103 each are made to electrically communicate with a control circuit (not shown) that selectively imparts an electric signal to each tabular piezoelectric actuator element 101. Accordingly, the electric signal is imparted to each tabular piezoelectric actuator element 101 via the printed circuit boards 103.

Next described is the matrix-arrayed piezoelectric actuator of the related art 2 shown by FIG. 20. As illustrated, this has tabular piezoelectric actuator elements 101, a substrate 102, a flexible printed circuit (FPC) board 106, and a conductor wiring pattern 105. On both the two major faces of each of the matrix-arrayed tabular piezoelectric actuator elements 101 on the substrate 102, formed is a thin electrode film, and one of the two major faces thereof is bonded to the substrate 102. In the area except the sections in which each tabular piezoelectric actuator element 101 is bonded to the substrate 102, all the actuator elements 101 are completely electrically insulated from the substrate 102. The conductor wiring pattern 105 is screen-printed on the substrate 102, extending from the thin electrode film formed on the other major face of every tabular piezoelectric actuator element 101 to the flexible printed circuit board 106. The thin electrode film formed on each tabular piezoelectric actuator element 101 is electrically bonded to the flexible printed circuit board 106 by heating the conductor wiring pattern 105 and the flexible printed circuit board 106 under pressure via a solder put therebetween. The flexible printed circuit board 106 is made to electrically communicate with a control circuit (not shown) that selectively imparts an electric signal to each tabular piezoelectric actuator element 101. Accordingly, the electric signal is imparted to each tabular piezoelectric actuator element 101 via the flexible printed circuit board 106.

One example of the related art 2 is proposed in JP-A-4-77257, which teaches a method of electrically bonding matrix-arrayed, multiple tabular piezoelectric actuator elements formed on a substrate to a flexible printed circuit board by once rearranging them into a one-dimensional matrix array conductor pattern through screen-printing on the substrate followed by electrically bonding the thus-rearranged one-dimensional pattern to the flexible printed circuit board.

JP-A-11-300956 (corresponding to U.S. Pat. No. 6,190,006) discloses another technique of separately bonding the individual piezoelectric elements to a flexible printed circuit board in fabricating an actuator. This is a related art 3. In this, provided are segment terminal electrodes each individually neighboring piezoelectric vibrators corresponding thereto, and the thickness of each segment terminal electrode is made larger than that of each piezoelectric vibrator to thereby ensure a space between the flexible printed circuit board and the piezoelectric vibrators so as to prevent any mutual mechanical contact of the actuator elements therein.

The actuator of the type mentioned above has not one but multiple matrix-arrayed piezoelectric actuator elements, in which various physical phenomena such as vibration or heat generation of the individual actuator elements make the actuator elements interfere with each other through the substrate, or they have some influences on the substrate itself and thereby have significant influences on the action of the individual actuator elements. Accordingly, it must be considered that the matrix-arrayed actuator has a circuit board as a part thereof.

However, the method of electrically bonding a thin electrode film formed on each tabular piezoelectric actuator element to a printed circuit board by bonding every wire extending from each actuator element to the printed circuit board, like the related art 1, is unfavorable to high-density matrix structures, since the height and the length of the wire loops are limited and therefore the number of the terminals capable of being bonded to the printed circuit board is limited. Another problem with the method is that the terminals must be bonded to the printed circuit board one by one, and the total process to finish the bonding operation takes too much time.

In the related art 1, all the bonded area must be sealed up with resin or the like for preventing the wires from touching the neighboring ones and from absorbing moisture to thereby evade electric short-circuits or insulation failure therein. However, the resin sealing is problematic in that it restricts the displacement level of the tabular piezoelectric actuator elements and therefore the actuator could not have the designed displacement characteristics.

On the other hand, the method of electrically bonding matrix-arrayed, multiple tabular piezoelectric actuator elements formed on a substrate to a flexible printed circuit board by once rearranging them into a one-dimensional matrix array conductor pattern through screen-printing on the substrate followed by electrically bonding the thus-rearranged one-dimensional pattern to the flexible printed circuit board, like the related art 2, is also unfavorable to high-density matrix structures, since the minimum wiring pattern width in screen printing therein is limited. For example, when tabular piezoelectric actuator elements each having an electrode-forming face size of 0.5 mm×0.5 mm are arrayed in a matrix size of 10×10 actuator elements, the minimum wiring pitch in screen printing is generally limited to 0.3 mm or so. In that case, therefore, the matrix pattern is limited to a pitch of 3.65 mm or so.

In the related art 2, the matrix conductor pattern is once rearranged to a one-dimensional pattern. In this, therefore, the region in which the thus-rearranged one-dimensional pattern is electrically bonded to a flexible printed circuit board shall increase with the increase in the matrix density (that is, the increase in the number of the patterned wiring lines), and, as a result, the probability of bonding failure occurrence exponentially increases, and the device reliability is difficult to ensure according to this method. Another problem with the method is that the productivity is low and the production costs are therefore high according to it.

In both the related arts 1 and 2, the direction of the printed circuit board in which the board is settled in the actuator is naturally limited to only the side opposite to the matrix array of tabular piezoelectric actuator elements in order to ensure the space region that corresponds to the electric bonding site of the substrate, and, as a result, the region above the tabular piezoelectric actuator elements shall be a dead space to lower the bonding efficiency of the flexible printed circuit board to the matrix-arrayed tabular piezoelectric actuator elements, and, in addition, the electric bonding itself of the printed circuit board to the matrix-arrayed actuator elements is extremely difficult. This is still another problem with these arts.

In the related arts 1 and 2, in addition, the vibration and the heat generation to be caused by the individual actuator elements' motion may often break the constitutive components of the actuator or may often cause some unstable motion of some actuator elements. This detracts from the practicability of the actuator, and this is still another problem with these arts.

The related art 3 is free from the problems with the related arts 1 and 2. However, this requires the segment terminal electrodes each individually corresponding to the piezoelectric vibrators therein, and its problem is that the production costs in this art are high.

SUMMARY OF THE INVENTION

The present invention has been made in view of the above circumstances and provides a lattice array-structured piezoelectric actuator and a method for producing the same. Specifically, the invention provides a circuit board-integrated actuator that enables high-density electric bonding of high-density array, or that is, matrix-arrayed tabular piezoelectric actuator elements to a circuit board and ensures the reliability, overall accuracy and stable motion of the actuator elements therein.

According to a first aspect of the invention, a lattice array-structured piezoelectric actuator having a plurality of tabular piezoelectric actuator elements disposed on a substrate and a flexible circuit board having a plurality of signal lines. A surface electrode of each of piezoelectric actuator elements is electrically connected to a predetermined position on a corresponding one of the plurality of signal lines on the flexible circuit board. The surface electrode of each of piezoelectric actuator elements is electrically connected with the corresponding one of the plurality of signal lines on the flexible circuit board via a bump with a predetermined gap.

According to a second aspect of the invention, the lattice array structure is a matrix array structure of the plurality of tabular piezoelectric actuator elements.

According to a third aspect of the invention, the surface electrode of each of piezoelectric actuator elements is a signal electrode used to select the corresponding piezoelectric actuator element. Each of piezoelectric actuator has a common electrode on an opposite surface thereof to a surface on which the signal electrode is formed.

According to a fourth aspect of the invention the tabular piezoelectric actuator elements, the common electrodes and the signal electrodes each have, on the same plane, an electric bonding area in which each of actuator elements is electrically bonded to the corresponding bump and an actuator area in which each actuator element is driven except the electric bonding area.

According to a fifth aspect of the invention, each of tabular piezoelectric actuator elements flexurally deforms in the actuator area to move in a thickness direction.

According to a sixth aspect of the invention, the flexible circuit board has electric bonding pads for electrically bonding the bumps to the actuator elements in positions corresponding to the electric bonding areas of the actuator elements.

According to a seventh aspect of the invention, the predetermined gap formed by the bumps between the tabular piezoelectric actuator elements and the flexible circuit board is not smaller than 10 $\mu$m.

According to an eighth aspect of the invention, the lattice array-structured piezoelectric actuator further has a rigid component on the substrate just below a bonding area between each of bumps and each of surface electrodes.

According to a ninth aspect of the invention, the substrate is formed of a windowless metal sheet and the rigid component is formed of a windowed metal sheet.

According to a tenth aspect of the invention, there is provided an ink droplet jetting head including a lattice array-structured piezoelectric actuator having a plurality of tabular piezoelectric actuator elements disposed on a substrate and a flexible circuit board having a plurality of signal lines. A surface electrode of each of piezoelectric actuator elements is electrically connected to a predetermined position on a corresponding one of the plurality of signal lines on the flexible circuit board. The surface electrode of each of piezoelectric actuator elements is electrically connected with the corresponding one of the plurality of signal lines on the flexible circuit board via a bump with a predetermined gap.

According to an eleventh aspect of the invention, the lattice array structure is a matrix array structure of the plurality of tabular piezoelectric actuator elements.

According to a twelfth aspect of the invention, the surface electrode of each of piezoelectric actuator elements is a signal electrode used to select the corresponding piezoelectric actuator element. Each of piezoelectric actuator has a common electrode on an opposite surface thereof to a surface on which the signal electrode is formed.

According to a thirteenth aspect of the invention, the tabular piezoelectric actuator elements, the common electrodes and the signal electrodes each have, on the same plane, an electric bonding area in which each of actuator elements is electrically bonded to the corresponding bump and an actuator area in which each actuator element is driven except the electric bonding area.

According to a fourteenth aspect of the invention, each of tabular piezoelectric actuator elements flexurally deforms in the actuator area to move in a thickness direction.

According to a fifteenth aspect of the invention, the flexible circuit board has electric bonding pads for electrically bonding the bumps to the actuator elements in positions corresponding to the electric bonding areas of the actuator elements.

According to a sixteenth aspect of the invention, the predetermined gap formed by the bumps between the tabular piezoelectric actuator elements and the flexible circuit board is not smaller than 10 µm.

According to a seventeenth aspect of the invention, the lattice array-structured piezoelectric actuator further comprises a rigid component on the substrate just below a bonding area between each of bumps and each of surface electrodes.

According to an eighteenth aspect of the invention, the substrate is formed of a windowless metal sheet and the rigid component is formed of a windowed metal sheet.

In the lattice array-structured piezoelectric actuator according to the invention, each of the matrix-arrayed multiple tabular piezoelectric actuator elements has a common electrode and a signal electrode formed on the two major faces (opposite to each other) thereof, respectively. The electric bonding area to which the rigid component is bonded and the electric bonding pads corresponding to arrangement in the electric bonding are formed on a surface opposite to the electric bonding area of the common electrode electrically connected to the substrate. The circuit board is made to face the actuator elements-having substrate on which the semi-spherical bumps composed of a conductive core and a conductive sealant is formed, and they are heated, pressed or vibrated whereby every signal electrode (in the electric bonding area of each actuator element) is electrically bonded to the corresponding bump on the circuit bond. Having the constitution, every bump composed of the core alone, or the core and the sealant or the sealant alone forms a gap between every tabular piezoelectric actuator element and the circuit board. The circuit board is a flexible printed circuit board of which the substrate is made of a flexible resin.

The actuator of the invention having the constitution as above realizes the following: The packaging density of the wiring circuits to be integrated with the actuator is increased since the circuit board is disposed above the vibration site of every actuator element; the gap formed by each pump between the flexible printed circuit board and the actuator elements improves the displacement efficiency of the actuator; the rigid component bonded to the actuator substrate in the site thereof below the electric bonding site of each actuator element ensures the reliability of the actuator; the flexible printed circuit board ensures stable production of the actuator (as it absorbs the thermal expansion difference between its substrate and the other components of the actuator); the flexible printed circuit board prevents vibration propagation (of both external vibration and internal vibration) between the actuator elements; the bumps are effective for heat removal from the actuator (as they form a gap between each actuator element and the circuit board and they well remove the heat from the circuit board); and the actuator having the advantages as above is applicable to inkjet recording heads and enhances the efficiency of the inkjet recording heads with it (for example, it enhances the reliability and the inkjet stability of the heads).

BRIEF DESCRIPTION OF THE DRAWINGS

Preferred embodiments of the present invention will be described in detail based on the following figures, wherein.

DETAILED DESCRIPTION OF THE PREFERRED EMDBOIMENTS

Preferred embodiments of the invention are described in more detail with reference to the drawings attached hereto, for which some examples of the invention are concretely described hereinunder.

Specifically, the following examples are to demonstrate circuit board-integrated matrix-arrayed piezoelectric actuators that are embodiments of the lattice array-structured piezoelectric actuator of the invention.

In the following description, the terminology "matrix" is meant to indicate a systematically lattice-arrayed condition, in which, however, the lattices are not required to always meet at right angles; the terminology "tabular" is meant to indicate a shape having at least one pair of facing planes including rectangular parallelepipeds, and this means that the cross-sectional profile of the area sandwiched between the pair of facing planes can be determined in any desired manner.

EXAMPLE 1

With reference to FIG. 1 to FIG. 5, one example of the circuit board-integrated matrix-arrayed piezoelectric actuator of the invention will be described.

Figure 1A:
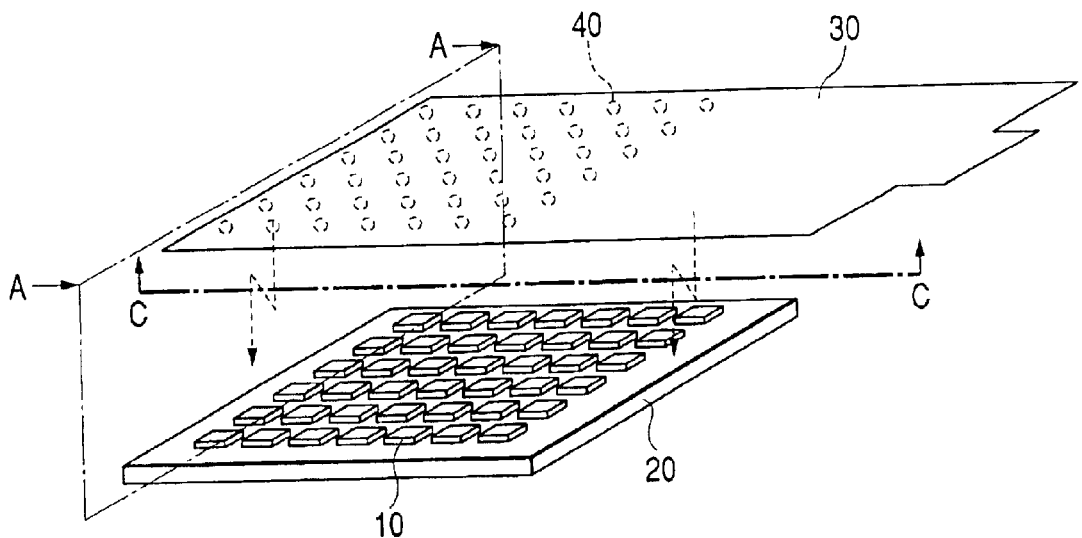
FIG. 1A is a perspective view showing the overall constitution of one example of the circuit board-integrated matrix-arrayed tabular piezoelectric actuator of the invention, in which the circuit board is not bonded to the actuator board.
Figure 1B:
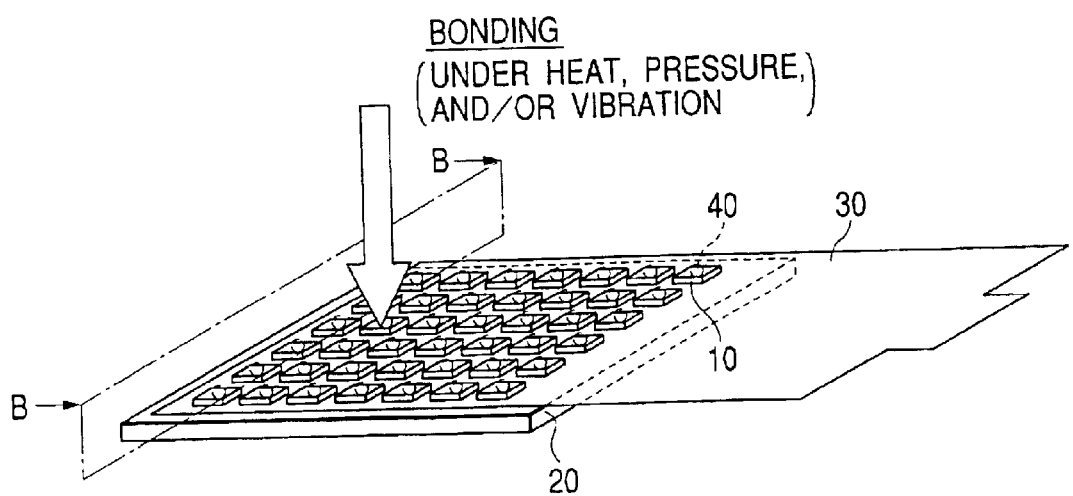
FIG. 1B is a perspective view showing the overall constitution of the circuit board-integrated matrix-arrayed tabular piezoelectric actuator of FIG. 1A, in which the circuit board has been bonded to the actuator board.
Figure 2:
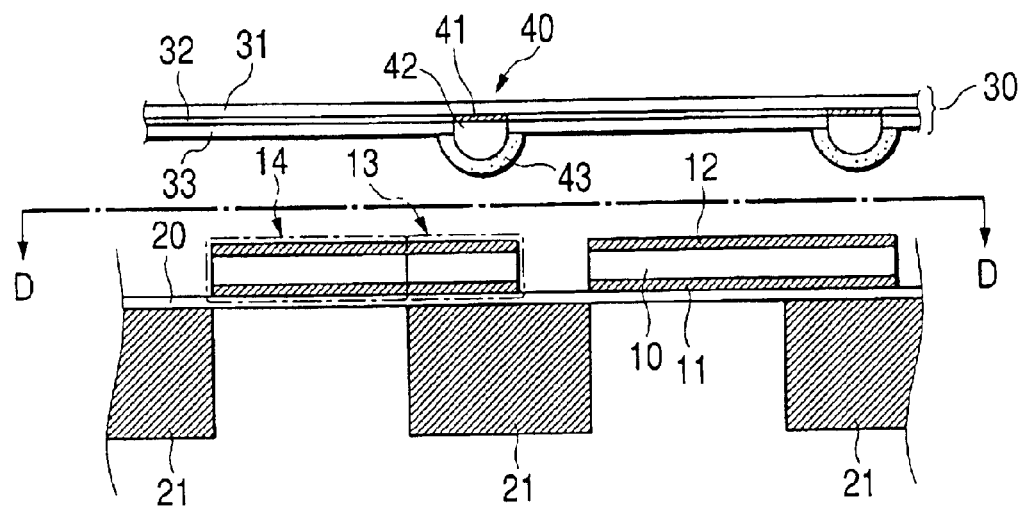
FIG. 2 is an A—A cross-sectional view of FIG. 1A.
Figure 3:
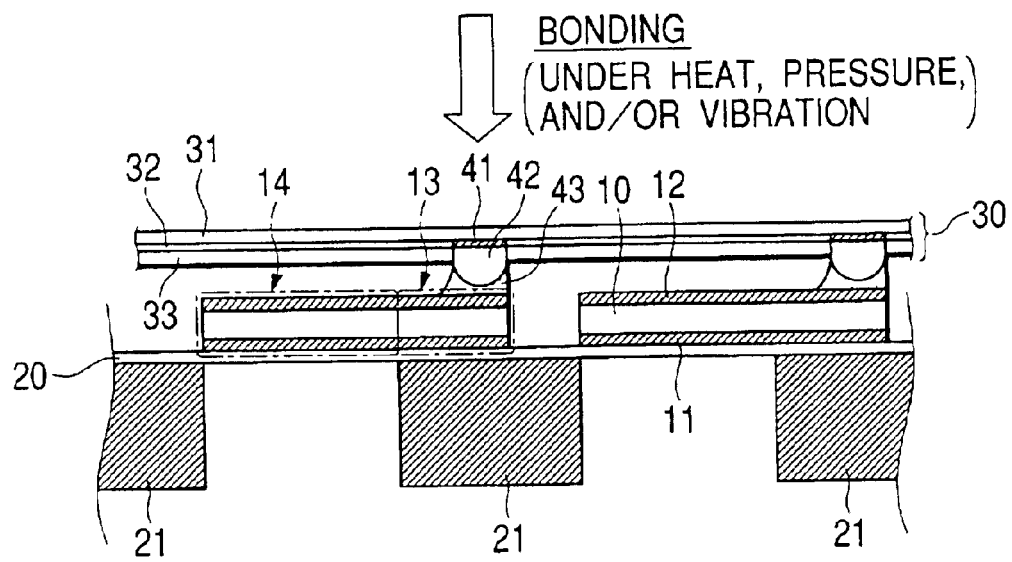
FIG. 3 is a B—B cross-sectional view of FIG. 1B.
Figure 4:
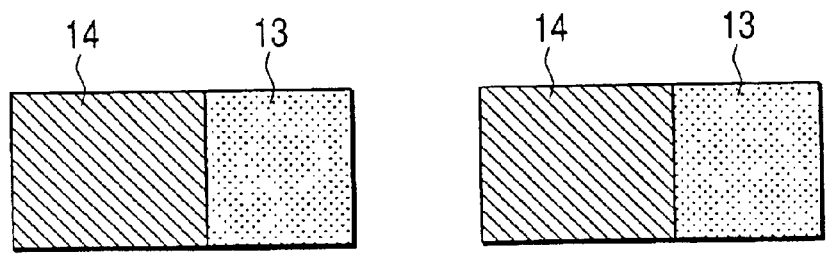
FIG. 4 is a D—D through-plan view of FIG. 2.
Figure 5:
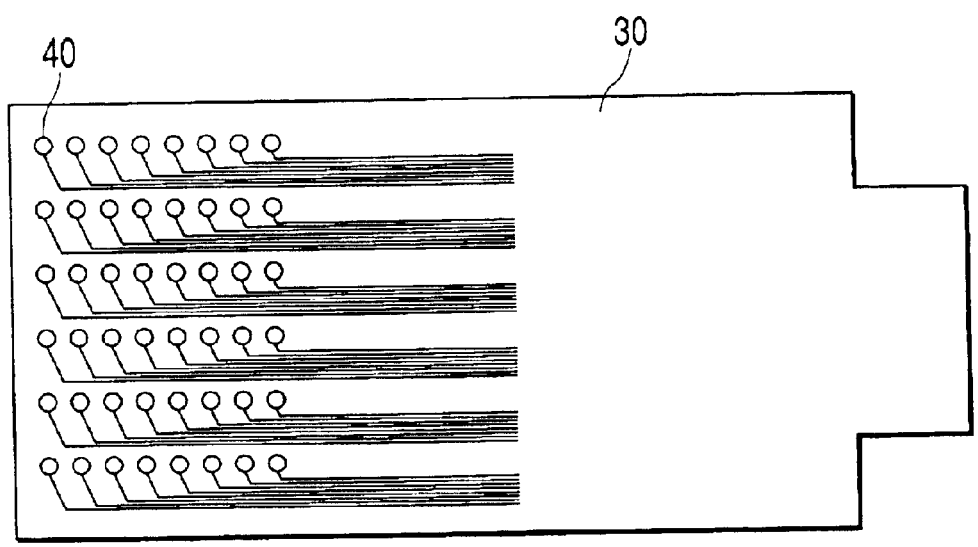
FIG. 5 is a C—C through-plan view of FIG. 1A.

FIGS. 1A and 1B are perspective views showing the overall constitution of the actuator of this example. FIG. 1A is the overall constitution thereof before bonded; and FIG. 1B is the overall constitution thereof after bonded. FIG. 2 is an A—A cross-sectional view of FIG. 1A; FIG. 3 is a B—B cross-sectional view of FIG. 1B; FIG. 4 is a D—D through-plan view of FIG. 2; and FIG. 5 is a C—C through-plan view of FIG. 1A.

First referred to is FIG. 1 to describe the overall constitution of the actuator of this example.

As illustrated, the actuator of this example has a substrate 20; multiple tabular piezoelectric elements 10 formed on the substrate 20 in a matrix pattern and having a thin electrode films formed on both the upper and lower faces thereof; a flexible printed circuit (FPC) board 30 having a flexible resin substrate; and multiple bumps 40 provided on one surface of the flexible printed circuit board 30 that faces the substrate 20. The multiple bumps 40 are so disposed that they individually correspond to the multiple tabular piezoelectric elements 10. Every bump 40 has a conductive core and a conductive sealant, and has semi-spherical shape. One of the thin electrode films of each tabular piezoelectric element 10 is bonded to the substrate 20. When the substrate 20 is made of a conductive metal such as stainless or the like, it may be electrically connected with the common electrode of each actuator element.

The method of providing bumps on the flexible printed circuit board 30 is known (for example, JP-A-2000-200962 and JP-A-6-97608).

Next referred to are FIGS. 2 to 5 to describe the constitutive components of the circuit board-integrated matrix-arrayed piezoelectric actuator of this example.

As in FIG. 2 and FIG. 3, the flexible printed circuit board 30 of this example has a three-layered structure composed of a base film 31, a wiring pattern 32 and a cover lay 33. In the flexible printed circuit board 30, electric bonding pads 41 are formed to correspond to the array of signal electrodes 12 not electrically connected to the substrate 20 on the matrix-arrayed tabular piezoelectric actuator elements 10. The electric bonding pads 41 are made to electrically communicate with a control circuit (not shown), and the multiple bumps 40 are formed on the pads 41.

As in FIG. 2 and FIG. 3, every bump 40 has a conductive core 42 and a conductive sealant 43 and has semi-spherical shape so as to ensure their contact with the tabular piezoelectric actuator elements 10. In particular, when the flexible printed circuit board 30 meets the tabular piezoelectric actuator elements 10 at some angles (in an area around a shoulder of a contact region in which the circuit board meets each actuator element) and when the tabular piezoelectric actuator elements 10 are made of a brittle material, the bumps 40 prevent the actuator elements 10 from being broken in a heating/pressing process mentioned hereinunder. As in FIG. 5, the multiple bumps 40 are so arrayed as to correspond to the matrix-arrayed tabular piezoelectric actuator elements 10 on the substrate 20 and are connected to the wiring pattern on the flexible printed circuit substrate 30. In that manner, an electric bonding area 13 of the signal electrode 12 of each tabular piezoelectric actuator elements 10 is made to face each bump 40 on the flexible printed circuit board 30, and the signal electrodes 12 are electrically connected with the corresponding pumps 40 by bonding them to each other in that condition. In this stage, since the wiring pattern of the flexible printed circuit board 30 is above the tabular piezoelectric actuator elements 10 owing to the presence of the bumps 40 therebetween, the packaging density of the flexible printed circuit board 30 is increased to the highest degree.

As in FIG. 2 and FIG. 3, the tabular piezoelectric actuator elements 10 are arrayed in a matrix pattern on the substrate 20. The two major faces (that are opposite to each other) of every tabular piezoelectric actuator element 10 separately have the common electrode 11 and the signal electrode 12 formed thereon, respectively. All the common electrodes 11 are electrically connected with the substrate 20. As in FIG. 4, every tabular piezoelectric actuator element 10 is divided into the electric bonding area 13 and an actuator area 14. The electric bonding area 13 corresponds to any of rigid components 21 that are bonded to the face of the substrate 20 opposite to the face thereof to which the tabular piezoelectric actuator elements 10 are bonded. However, each tabular piezoelectric actuator element 10 is divided into the electric bonding area 13 and the actuator area 14 only in point of the function of the thus-divided two areas, depending on the bonding position of the rigid components 21, and the two areas do not differ at all in point of their material and constitution. When each actuator element 10 receives an electric signal imparted thereto, the actuator area 14 of the signal electrode thereof undergoes displacement in the vertical direction essentially owing to the flexural deformation thereof, while, on the other hand, the electric bonding area 13 undergoes plane-directional (that is, horizontal) displacement.

As in FIG. 2 and FIG. 3, one face of the substrate 20 is electrically bonded to the common electrode 11 of each tabular piezoelectric actuator element 10, and the other face thereof has rigid components 21 bonded thereto in the site just below the electric bonding area 13 of each tabular piezoelectric actuator element 10. The rigid components 21 prevent the flexural deformation of the tabular piezoelectric actuator elements 10 that may be caused by the stress concentration to occur under pressure in the tip of each bump 40 on the flexible printed circuit board 30 and in the electric bonding area 13 of each tabular piezoelectric actuator element 10, and also prevent the electric bonding area 13 itself from being vibrated.

With further reference to FIG. 2 and. FIG. 3, next described is the method of bonding the tabular piezoelectric actuator elements 10 formed on the substrate 20 to the bumps 40 formed on the flexible printed circuit board 30.

First, the substrate 20 is put to face the flexible printed circuit board 30 while the multiple tabular piezoelectric actuator elements 10 are so positioned as to correspond to the multiple bumps 40 and are heated, pressed or vibrated to thereby electrically bond the multiple tabular piezoelectric actuator elements 10 to the corresponding bumps 40. After thus bonded, every bump 40 forms a gap between every tabular piezoelectric actuator element 10 and the flexible printed circuit board 30. In that condition, electric signals from the control circuit are selectively applied to the tabular piezoelectric actuator elements 10, via the flexible printed circuit board 30 and the bumps 40 and via the thin electrode film formed on every tabular piezoelectric actuator element 10.

Again referred to is FIG. 3 to describe the action of the actuator elements of the circuit board-integrated matrix-arrayed piezoelectric actuator of Example 1 of the invention.

The action of the actuator elements of this example includes first action and second action.

The first action is as follows: When each tabular piezoelectric actuator element 10 receives an electric signal applied thereto from a control circuit (not shown) via the substrate 20 and the flexible printed circuit board 30, it generates mechanical force to elongate or strain its common electrode 11 and signal electrode 12 in predetermined directions.

The second action is as follows: When each tabular piezoelectric actuator element 10 receives an electric signal applied thereto from a control circuit (not shown) via the substrate 20 and the flexible printed circuit board 30, it expands and shrinks in the direction parallel to its common electrode 11 and signal electrode 12. However, since the common electrode 11 of each tabular piezoelectric actuator element 10 is restrained by the substrate 20, the signal electrode 12 thereof is thereby expanded and shrunk. With that, the expanding and shrinking motion of each actuator element 10 in the direction parallel to the common electrode 11 and the signal electrode 12 thereof is converted into a flexural motion in the direction vertical to the two electrodes, and each tabular piezoelectric actuator element 10 therefore generates mechanical force to elongate or strain its common electrode 11 and signal electrode 12 in predetermined directions.

According to such constitution mentioned above, the specific motion of the individual actuator elements of this example brings about the following advantages of the circuit board-integrated matrix-arrayed piezoelectric actuator of this example.

Since the high-density circuits-integrated matrix actuator of the invention has a gap of at least 10 μm between the flexible printed circuit board 30 and each tabular piezoelectric actuator element 10, it is prevented that the flexible printed circuit board 30 contacts with the tabular piezoelectric actuator elements 10. Therefore, the circuit board 30 does not interfere with the vibration action of the tabular piezoelectric actuator elements 10.

In addition, the heat generated by the tabular piezoelectric actuator elements 10 that act as above is removed by the air stream that runs through the gaps of at least 10 μm each, and the actuator elements 10 are thereby cooled. Further, the heat diffuses efficiently owing to the thermal conduction of the bumps 40 each composed of the core 42 and the sealant 43, and the actuator elements 10 are also thereby cooled.

The vibration between the tabular piezoelectric actuator elements 10 and the flexible printed circuit board 30 that is transmitted by the action of the actuator transfers to the flexible printed circuit board 30 via the core 42 and the sealant 43 of each bump 40 and is immediately absorbed by it. Specifically, the stress that may occur between the tabular piezoelectric actuator elements 10 and the flexible printed circuit board 30 may be reduced owing to the damping effect of the actuator, and the actuator therefore ensures high reliability.

Further, since the actuator is integrated with a flexible printed circuit board, the unnecessary vibration generated by the individual actuator elements via the bumps 40 is absorbed and attenuated by the flexible printed circuit board, and its influence on the neighboring actuator elements is negligible.

In the actuator of this example, the electric bonding area 13 of the signal electrode 12 of each of the matrix-arrayed tabular piezoelectric actuator elements 10 is made to face the corresponding bump 40 on the flexible printed circuit board 30, and they are bonded to each other in that condition to thereby electrically connect the signal electrode 12 to the corresponding bump 40. Accordingly, in this, since the wiring pattern of the flexible printed circuit board 30 is positioned above the tabular piezoelectric actuator elements 10, the packaging density of the flexible printed circuit board 30 is increased to the highest degree. For example, when tabular piezoelectric actuator elements each having an electrode-forming face size of 0.5 mm×0.5 mm are arrayed in a matrix size of 10×10 actuator elements, the minimum wiring pitch in screen printing in the related art is generally limited to 0.3 mm or so. In that case, therefore, the matrix pattern is limited to a pitch of 3.65 mm or so. However, according to the constitution of the present invention, the matrix pattern can be densified up to a pitch of 0.575 mm (in case where the wiring pitch in the flexible printed circuit board 30 is 0.05 mm).

In the actuator of the invention, in addition, there exists a gap formed by the bump 40—which is the core 42 alone, or a combination of the core 42 and the sealant 43, or the sealant 43 alone—between every tabular piezoelectric actuator element 10 and the flexible printed circuit board 30, and therefore the actuator area 14 of the signal electrode 12 of each tabular piezoelectric actuator element 10 is allowed to act free, not interfered with any other.

In general, rigid circuit boards often cause bonding failure thereon as they readily warp. As opposed to them, the substrate of the flexible printed circuit board 30 is made of flexible resin such as polyimide or the like. When the circuit board 30 of the type is pressed against the actuator elements 10 formed on the substrate 20 by the use of a metallic tool of high surface smoothness, its flexible substrate can completely absorb the warping of the circuit board 30 and even the height difference between the individual bumps 40. In addition, the flexible printed circuit board 30 can well follow the pitch change of the matrix-arrayed multiple tabular piezoelectric actuator elements 10 that may be caused by the ambient temperature change around them.

Accordingly, the invention realizes a high-density circuits-integrated matrix actuator of guaranteed high reliability, overall accuracy and stable motion.

EXAMPLE 2

With reference to FIG. 6 to FIG. 11, this is to demonstrate another example of the circuit board-integrated-matrix-arrayed piezoelectric actuator of the invention.

Figure 6A:
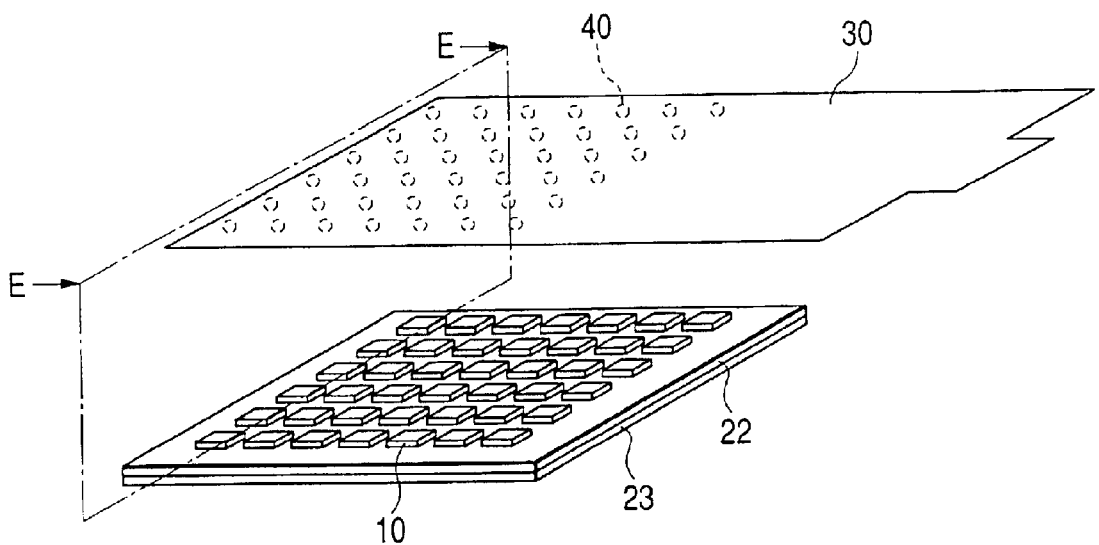
FIG. 6A is a perspective view showing the overall constitution of another example of the circuit board-integrated matrix-arrayed tabular piezoelectric actuator of the invention, in which the circuit board is not bonded to the actuator board.
Figure 6B:
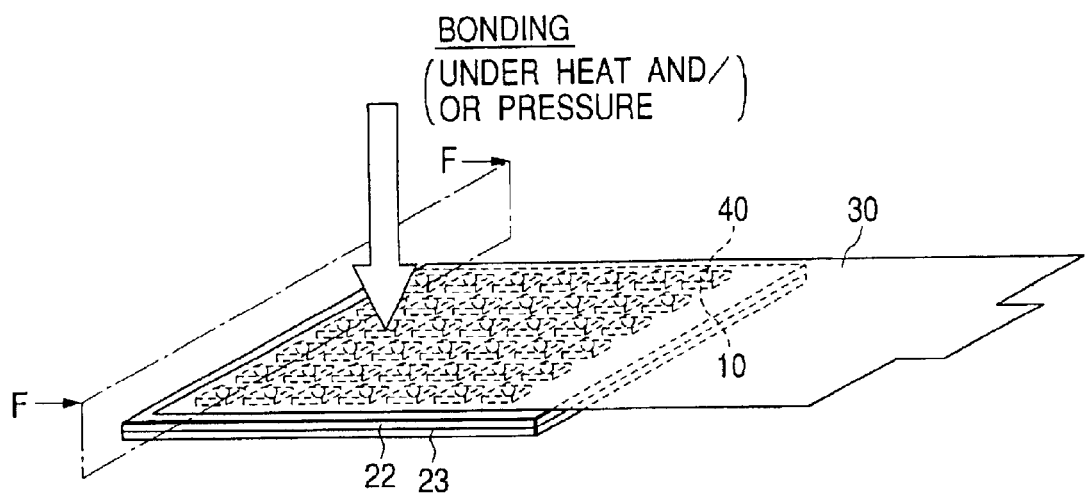
FIG. 6B is a perspective view showing the overall constitution of the circuit board-integrated matrix-arrayed tabular piezoelectric actuator of FIG. 6A, in which the circuit board has been bonded to the actuator board.
Figure 7:
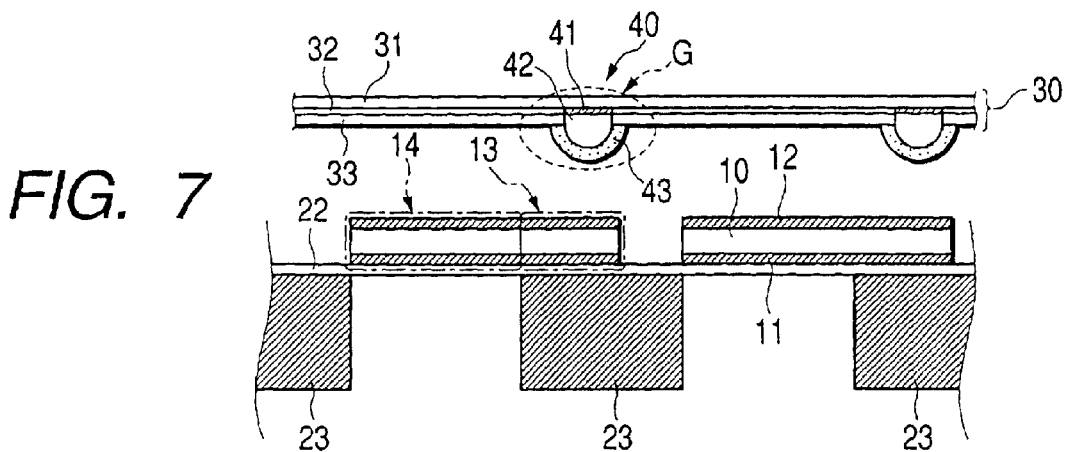
FIG. 7 is an E—E cross-sectional view of FIG. 6A.
Figure 8:
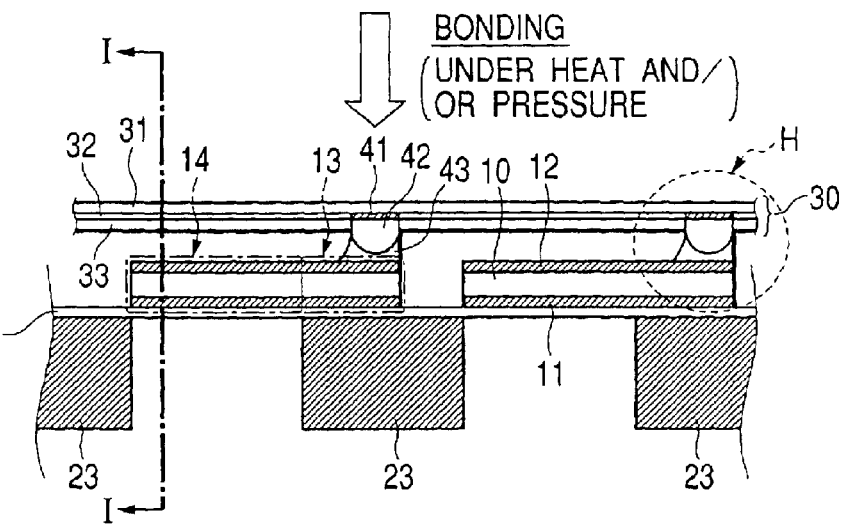
FIG. 8 is an F—F cross-sectional view of FIG. 6B.
Figure 9:
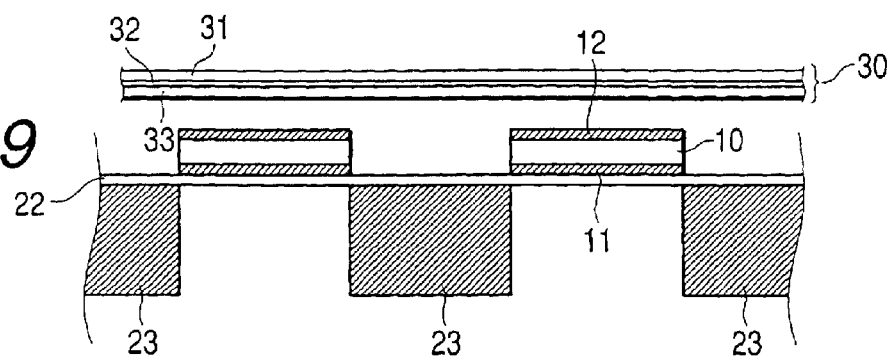
FIG. 9 is an I—I cross-sectional view of FIG. 8.
Figure 10:
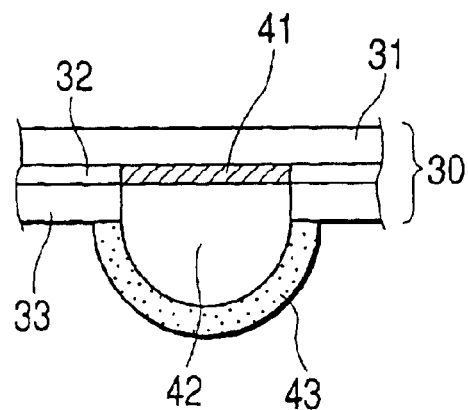
FIG. 10 is an enlarged view showing in detail the part G of FIG. 7.
Figure 11:
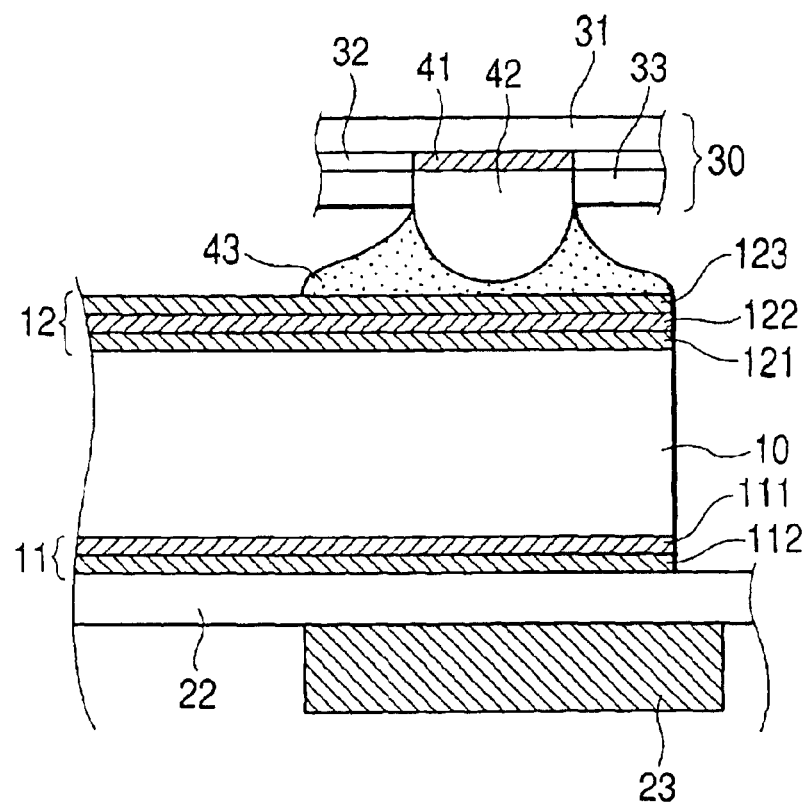
FIG. 11 is an enlarged view showing in detail the part H of FIG. 8.

FIGS. 6A and 6B are perspective views showing the overall constitution of the actuator of this example. FIG. 6A is the overall constitution thereof before bonded; and FIG. 6B is the overall constitution thereof after bonded. FIG. 7 is an E—E cross-sectional view of FIG. 6A; FIG. 8 is an F—F cross-sectional view of FIG. 6B; FIG. 9 is an I—I cross-sectional view of FIG. 8; FIG. 10 is an enlarged view showing in detail the part G of FIG. 7; and FIG. 11 is an enlarged view showing in detail the part H of FIG. 8.

The constitution of the actuator of this example is almost the same as that of the actuator of Example 1 mentioned above, but the two differ in that two-layered, thin stainless sheets 22, 23 are used in Example 2 in place of the substrate 20 and the rigid components 21 used in Example 1. Precisely, in Example 2, a windowless thin stainless sheet 22 is used for the substrate 20, and a windowed thin stainless sheet 23 for the rigid components 21.

First referred to is FIG. 6 to describe the overall constitution of the circuit board-integrated matrix-arrayed piezoelectric actuator of Example 2 of the invention.

As illustrated, the actuator of this example has a windowless thin stainless sheet 22; multiple tabular piezoelectric elements 10 formed on the windowless thin stainless sheet 22 in a matrix pattern and having a thin electrode film formed on both the upper and lower faces thereof; a flexible printed circuit board 30 having a flexible resin substrate; and multiple bumps 40 provided on one surface of the flexible printed circuit board 30 that faces the windowless thin stainless sheet 22. The multiple bumps 40 are so disposed that they individually correspond to the multiple tabular piezoelectric elements 10. Every bump 40 is composed of a conductive core and a conductive sealant, and is semi-spherical. One of the thin electrode films of each tabular piezoelectric element 10 is bonded to the windowless thin stainless sheet 22.

Next referred to are FIGS. 7 to 11 to describe the constitutive components of the circuit board-integrated matrix-arrayed piezoelectric actuator of this example.

As in FIGS. 7 to 11, the flexible printed circuit board 30 of this example has a three-layered structure composed of a base film 31, a wiring pattern 32 and a cover lay 33, in which are formed electric bonding pads 41 that correspond to the array of signal electrodes 12 on the tabular piezoelectric actuator elements 10. On each pad 41, formed is a semi-spherical core 42 of Cu through electrolytic plating; and on the core 42, formed is a sealant 43 of solder also through electrolytic plating. The core 42 and the sealant 43 form every semi-spherical bump 40. It is generally known that Cu has a Young's modulus of $112.5 \times 10^5$ (kg/cm$^2$). In addition, Cu is extremely soft, and the core 42 of Cu can readily absorb the height difference between the individual bumps 40 as it deforms by itself in the heating and pressing process to be mentioned hereinunder. However, since Cu and solder readily form a brittle alloy layer while stored on any ordinary condition, a stopper layer of Ni is formed in the interface between Cu and solder in this example. The thickness of the solder plate layer is at least 5 $\mu$m. This is because the thickness of the solder plate layer has a close correlation with the wet spreading diameter of the solder heated in the heating and pressing process to be mentioned hereinunder. If the thickness of the solder plate layer is smaller than 5 $\mu$m, the mechanical bonding strength of the solder to the tabular piezoelectric actuator elements 10 is low, and the reliability of the fabricated actuator of this example is thereby lowered. In this example, the ratio of the height of Cu to the thickness of solder is 5/1, and 100 bumps 40 each having a height of from 5 to 100 $\mu$m are formed on the flexible printed circuit board 30 each in the position corresponding to the signal electrode 12 of every tabular piezoelectric actuator element 10 that will be mentioned hereinunder.

Regarding the materials of the three layers to constitute the flexible printed circuit board 30, the base film 31 is made of polyimide, having a thickness of 25 $\mu$m; the wiring pattern 32 is made of Cu, having a thickness of 9 $\mu$m; and the cover lay 33 is made of polyimide, having a thickness of 12.5 $\mu$m. The electric bonding pads 41 are circular, each having a diameter $\phi$ of 150 $\mu$m. Corresponding to them, the wiring pattern 32 has 100 lines formed at a pitch of 50 $\mu$m. For comparison, circular electric bonding pads 41 of 150 $\mu$m$\phi$ are formed on an alumina substrate having a thickness of 100 $\mu$m, and, corresponding to them, a Cu wiring pattern 32 of 100 lines is formed thereon at a pitch of 50 $\mu$m.

The tabular piezoelectric actuator elements 10 are made of a piezoelectric material. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. In view of the thickness of the electrode, the Ni layer must have a thickness of at least 500 nm. This is for preventing the Ni loss that may be caused by the formation of an alloy layer of Ni and solder in the heating and pressing process to be mentioned hereinunder or after the constitutive components have aged and degraded. If Ni is lost, the solder of the bumps 40 will be in direct contact with the Cr layer of the signal electrode 12. If so, since Cr does not form an alloy layer with solder, the mechanical bonding strength of the tabular piezoelectric actuator elements 10 to the flexible printed circuit board 30 noticeably lowers and, as a result, the reliability of the fabricated actuator will be thereby lowered. In this example, the thickness of the Ni layer is 600 nm. Au is formed for ensuring the solder wettability, and the thickness of its layer is at least 50 nm. Both the common electrode 11 and the signal electrode 12 are formed according to a thin-film forming method of sputtering or plating.

As so mentioned hereinabove, the substrate is formed of a windowless thin stainless sheet 22 and a windowed thin stainless sheet 23. The windowless thin stainless sheet 22 is for the substrate 20 in Example 1 mentioned above, and the windowed thin stainless sheet 23 is for the rigid components 21 therein. In this example, the substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 μm thick. Next, 100 tabular piezoelectric actuator elements 10 of rectangular pieces of 0.5 mm×1 mm×0.05 mm (thickness) that are coated with the electrodes in the manner as above are prepared, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22. For electromechanically bonding the common electrode 11 of each tabular piezoelectric actuator element 10 to the substrate, windowless thin stainless sheet 22, used is an electroconductive epoxy resin adhesive that ensures electric conduction between the tabular piezoelectric actuator elements 10 and the windowless thin stainless sheet 22.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding bumps 40 formed on the flexible printed circuit board 30 or on the alumina substrate in the previous step, and these are heated under pressure to thereby electrically bond the signal electrodes 12 to the corresponding bumps 40. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42, between every tabular piezoelectric actuator element 10 and the flexible printed circuit board 30 or the alumina substrate, and therefore the actuator area 14 of the signal electrode 12 of each tabular piezoelectric actuator element 10 is allowed to act free, not interfered with any other.

The circuit board-integrated matrix-arrayed piezoelectric actuator of Example 2, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 μm-thick, windowless thin stainless sheet 22 is measured through the windows of the windowed thin stainless sheet 23. In addition, the temperature of the surface of the flexible printed circuit board 30 or that of the alumina substrate is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10. The test data are given in Table 1.

TABLE 1

| Height of Bumps | 5 μm | 10 μm | 50 μm | 100 μm | 10 μm (on alumina substrate) |
|---|---|---|---|---|---|
| Average Temperature Increase in Actuator Elements after 10 seconds | 140° C. | 30° C. | 14° C. | 10° C. | 0° C. |
| Displacement of 0.2 μm or more | 10 | 100 | 100 | 100 | 0 |
| Average Temperature Increase in Actuator Elements after 1 hour | 0° C. | 37° C. | 18° C. | 15° C. | 0° C. |
| Displacement of 0.2 μm or more | 0 | 100 | 100 | 100 | 100 |
| Electric Conduction | x | ○ | ○ | ○ | x |

As in Table 1, in the actuator having a bump height of 5 μm, the number of the actuator elements having a displacement of 0.2 μm or more after driven for 1 hour is 0, and no electric conduction is seen therein. However, in the other actuators of this example having a bump height of 10 μm or more, the number of the actuator elements having a displacement of 0.2 μm or more is 100, and electric conduction is seen therein. On the other hand, in the actuator formed on an alumina substrate and having a bump height of 10 μm, the number of the actuator elements having a displacement of 0.2 μm or more is 0, and no electric conduction is seen therein.

In the actuator having a bump height of 5 μm, the actuator elements, the bumps, the substrate and the interconnections are observed after driven for 1 hour. In this, some bumps are broken and some wiring lines are cut. However, in the other actuators of this example having a bump height of 10 μm or more, nothing is broken. On the other hand, in the actuator having an alumina substrate, some bonding failure is seen between the bumps and the actuator elements, the substrate is broken and the interconnections are also broken, since the substrate is warped and since the bump height is not uniform.

The flexible printed circuit board-integrated actuators of this example having a bump height of 10 μm or more suffer little temperature increase and ensure good electric isolation. In these, in addition, every actuator element shows stable displacement. These confirm the practicability of the actuators of this example.

EXAMPLE 3

With reference to FIG. 7 to FIG. 12, this is to demonstrate still another example of the circuit board-integrated matrix-arrayed piezoelectric actuator of the invention.

Figure 12:
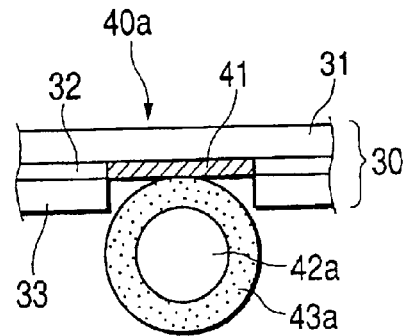
FIG. 12 is a cross-sectional view showing the constitution of the bumps in the circuit board-integrated matrix-arrayed piezoelectric actuator of Example 3 of the invention.

FIG. 12 is a cross-sectional view showing the constitution of the bumps in the circuit board-integrated matrix-arrayed piezoelectric actuator of Example 3 of the invention.

The constitution of the actuator of this example is almost the same as that of the actuator of Example 2 mentioned above, but the two differ in that spherical bumps 40a as in FIG. 12 are used in Example 3 in place of the semi-spherical bumps 40 used in Example 2. Precisely, in Example 3, formed are spherical bumps 40a each composed of a spherical core 42a and a sealant 43b that covers the outer surface of the core 42a, in place of the semi-spherical bumps 40 in Example 2.

The overall constitution of the actuator of this example is the same as that of the actuator of Example 2, and its description is omitted herein.

With reference to FIGS. 7 to 12, the constitutive components of the circuit board-integrated matrix-arrayed piezoelectric actuator of this example are described.

The flexible printed circuit board 30 has a three-layered structure composed of a base film 31, a wiring pattern 32 and a cover lay 33, in which are formed electric bonding pads 41 that correspond to the array of signal electrodes 12 on the tabular piezoelectric actuator elements 10. On each pad 41, mounted is a ball that is prepared by covering the surface of a spherical core 42a of Cu with a sealant 43a of solder according to a plating method. The solder sealant 43a of the ball is melted under heat, whereby the ball is bonded to the pad 41 to form a spherical bump 40a on the pad 41. For the core 42a of the spherical bump 40a, Cu is selected and used herein. Since Cu and solder readily form a brittle alloy layer while stored on any ordinary condition, a stopper layer of Ni is formed in the interface between Cu and solder in this example. Next, using the balls each prepared by covering the surface of the spherical core 42a of Cu with the sealant 43a of solder according to a plating method, 100 spherical bumps 40a are formed on the flexible printed circuit board 30 each in the position corresponding to the signal electrode 12 of every tabular piezoelectric actuator element 10 that will be mentioned hereinunder. The ratio of the height of each bump 40a to the thickness of the solder layer thereof is 5/1; and the height of the bumps 40a falls between 5 and 100 μm. Regarding the materials to constitute the flexible printed circuit board 30, the base film 31 is made of polyimide, having a thickness of 25 μm; the wiring pattern 32 is made of Cu, having a thickness of 9 μm; and the cover lay 33 is made of polyimide, having a thickness of 12.5 μm. The electric bonding pads 41 are circular, each having a diameter φ of 150 μm. Corresponding to them, the wiring pattern 32 has 100 lines formed at a pitch of 50 μm.

The tabular piezoelectric actuator elements 10 are made of a piezoelectric material, like in Example 2. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. In view of the thickness of the electrode, the Ni layer must have a thickness of at least 500 nm. This is for preventing the Ni loss that may be caused by the formation of an alloy layer of Ni and solder in the heating and pressing process to be mentioned hereinunder or after the constitutive components have aged and degraded. If Ni is lost, the solder of the bumps 40 will be in direct contact with the Cr layer of the signal electrode 12. If so, since Cr does not form an alloy layer with solder, the mechanical bonding strength of the tabular piezoelectric actuator elements 10 to the flexible printed circuit board 30 noticeably lowers and, as a result, the reliability of the fabricated actuator will be thereby lowered. In this example, the thickness of the Ni layer is 600 nm. Au is formed for ensuring the solder wettability, and the thickness of its layer is at least 50 nm. Both the common electrode 11 and the signal electrode 12 are formed according to a thin-film forming method of sputtering or plating.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. The substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 μm thick. Next, 100 tabular piezoelectric actuator elements 10 of rectangular pieces of 0.5 mm×1 mm×0.05 mm (thickness) that are coated with the electrodes in the manner as above are prepared, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding spherical bumps 40a formed on the flexible printed circuit board 30 in the previous step, and these are heated under pressure to thereby electrically bond the signal electrodes 12 to the corresponding spherical bumps 40a. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42a, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 3, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 $\mu$m-thick, windowless thin stainless sheet 22 is measured through the windows of the windowed thin stainless sheet 23. In addition, the temperature of the surface of the flexible printed circuit board 30 is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10. The test data are given in Table 2.

TABLE 2

| Height of Bumps | 5 $\mu$m | 10 $\mu$m | 50 $\mu$m | 100 $\mu$m |
|---|---|---|---|---|
| Average Temperature Increase in Actuator Elements after 10 seconds | 138° C. | 31° C. | 14° C. | 9° C. |
| Displacement of 0.2 $\mu$m or more | 15 | 100 | 100 | 100 |
| Average Temperature Increase in Actuator Elements after 1 hour | 0° C. | 35° C. | 20° C. | 14° C. |
| Displacement of 0.2 $\mu$m or more | 0 | 100 | 100 | 100 |
| Electric Conduction | x | ○ | ○ | ○ |

As in Table 2, in the actuator having a bump height of 5 $\mu$m, the number of the actuator elements having a displacement of 0.2 $\mu$m or more after driven for 1 hour is 0, other actuators of this example having a bump height of 10 $\mu$m or more, the number of the actuator elements having a displacement of 0.2 $\mu$m or more is 100, and electric conduction is seen therein.

In the actuator having a bump height of 5 $\mu$m, the actuator elements, the bumps, the substrate and the interconnections are observed after driven for 1 hour. In this, some bumps are broken and some wiring lines are cut. However, in the other actuators of this example having a bump height of 10 $\mu$m or more, nothing is broken.

The flexible printed circuit board-integrated actuators of this example having a bump height of 10 $\mu$m or more suffer little temperature increase and ensure good electric isolation. In these, in addition, every actuator element shows stable displacement. These confirm the practicability of the actuators of this example.

As in the above, Example 3 demonstrates the advantages of the invention, like Example 2.

EXAMPLE 4

With reference to FIG. 7 to FIG. 11 and FIG. 13, this is to demonstrate still another example of the circuit board-integrated matrix-arrayed piezoelectric actuator of the invention.

Figure 13:
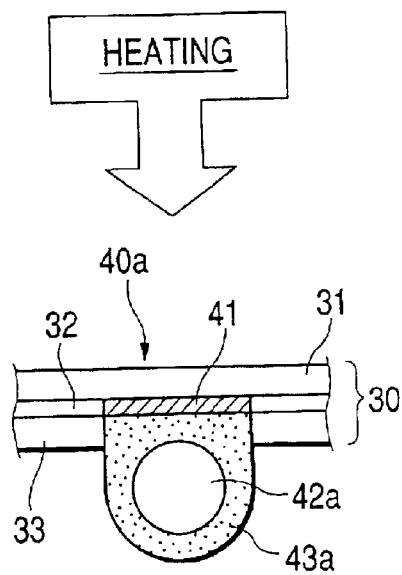
FIG. 13 is a cross-sectional view showing the constitution of the actuator element interconnection in the circuit board-integrated matrix-arrayed piezoelectric actuator of Example 4 of the invention.
Figure 13:
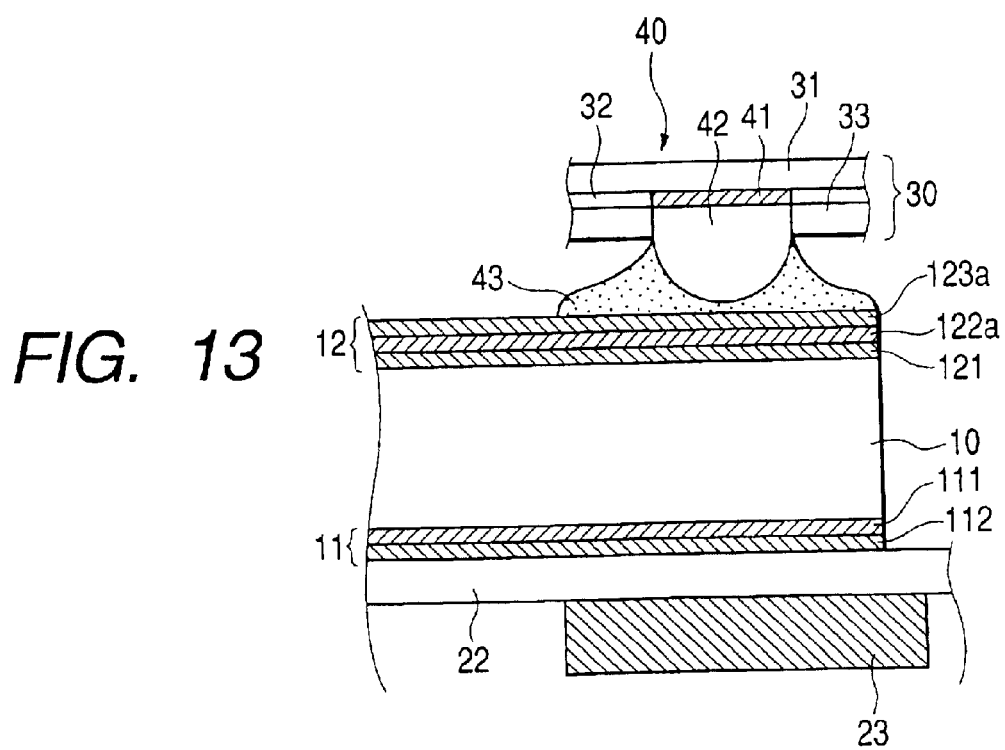

FIG. 13 is a cross-sectional view showing the constitution of the actuator elements in the circuit board-integrated matrix-arrayed piezoelectric actuator of Example 4 of the invention.

The constitution of the actuator of this example is almost the same as that of the actuator of Example 2 mentioned above. However, the two differ in that, in Example 4, the signal electrode 12 of each tabular piezoelectric actuator element 10 has a three-layered structure like in Example 2 only in the necessary site but has a single-layered structure in the remaining site as in FIG. 13. Precisely, in Example 4, the signal electrode 12 of each of the matrix-arrayed tabular piezoelectric actuator elements 10 has a three-layered structure composed of a first layer 121 of Cr, a second layer 122a of Ni and a third layer 123a of Au only in the electric bonding area 13 thereof, but in its actuator area 14, the second layer 122a and the third layer 123a are removed, and only the first layer 121 of Cr is formed.

The overall constitution of the actuator of this example is the same as that of the actuator of Example 2, and its description is omitted herein.

With reference to FIGS. 7 to 11 and FIG. 13, the constitutive components of the circuit board-integrated matrix-arrayed piezoelectric actuator of this example are described.

The flexible printed circuit board 30 has a three-layered structure composed of a base film 31, a wiring pattern 32 and a cover lay 33, and bumps 40 are formed thereon, each corresponding to the electric bonding area 13 of every tabular piezoelectric actuator element 10. The signal electrode 12 of every tabular piezoelectric actuator element 10 is electrically bonded to the corresponding bump 40 by heating them under pressure. In this stage, the actuator area 14 of each actuator element 10 has only the first layer 121 of Cr. Since Cr does not form an alloy layer with solder, the Cr layer prevents solder from flowing away into the actuator area 14. In this example, 100 bumps 40 each having a height of 300 $\mu$m are formed on the flexible printed circuit board 30, each corresponding to the position of the signal electrode 12 of every tabular piezoelectric actuator element 10 that will be mentioned hereinunder. The ratio of the Cu height and the solder thickness in each bump 40 is 5/1. In this example, the bump height is large. This is for more definitely clarifying the effect of this example. Regarding the materials to constitute the flexible printed circuit board 30, the base film 31 is made of polyimide, having a thickness of 25 $\mu$m; the wiring pattern 32 is made of Cu, having a thickness of 9 $\mu$m; and the cover lay 33 is made of polyimide, having a thickness of 12.5 $\mu$m. The electric bonding pads 41 are circular, each having a diameter $\phi$ of 150 $\mu$m. Corresponding to them, the wiring pattern 32 has 100 lines formed at a pitch of 50 $\mu$m.

The tabular piezoelectric actuator elements 10 are made of a piezoelectric material. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122a of Ni and a third layer 123a of Au. The reason why Cr is selected for the first layer 121 is because it compensates for the poor adhesiveness of Ni to the tabular piezoelectric actuator elements 10. In view of the thickness of the electrode, the Ni layer must have a thickness of at least 500 nm. This is for preventing the Ni loss that may be caused by the formation of an alloy layer of Ni and solder in the heating and pressing process to be mentioned hereinunder or after the constitutive components have aged and degraded. If Ni is lost, the solder of the bumps 40 will be in direct contact with the Cr layer of the signal electrode 12. If so, since Cr does not form an alloy layer with solder, the mechanical bonding strength of the tabular piezoelectric actuator elements 10 to the flexible printed circuit board 30 noticeably lowers and, as a result, the reliability of the fabricated actuator will be thereby lowered. In this example, the thickness of the Ni layer is 600 nm. Au is formed for ensuring the solder wettability, and the thickness of its layer is at least 50 nm. In this example, every signal electrode 12 has a three-layered structure of the first layer 121 of Cr, the second layer 122a of Ni and the third layer 123a of Au only in the electric bonding area 13 of each actuator element 10, but has a single-layered structure of the first layer 121 of Cr alone in the actuator area thereof, as so mentioned hereinabove. Both the common electrode 11 and the signal electrode 12 are formed according to a thin-film forming method of sputtering or plating. For comparison, a comparative actuator sample is formed, in which the signal electrode of each actuator element has a three-layered structure of the first layer 121 of Cr, the second layer 122a of Ni and the third layer 123a of Au both in the electric bonding area 13 and the actuator area 14 of each actuator element 10.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. Concretely, the substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 µm thick. Next, 100 tabular piezoelectric actuator elements 10 of rectangular pieces of 0.5 mm×1 mm×0.05 mm (thickness) are prepared as in the above, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding bumps 40 formed on the flexible printed circuit board 30 in the previous step, and these are heated under pressure to thereby electrically bond the signal electrodes 12 to the corresponding bumps 40. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 4, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 µm-thick, windowless thin stainless sheet 22 is measured through the windows of the windowed thin stainless sheet 23. In addition, the temperature of the surface of the flexible printed circuit board 30 is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10. For comparison, the comparative actuator in which the signal electrode in the electric bonding area of each actuator element and that in the actuator area thereof both have the same layer constitution is tested in the same manner as above. The test data are given in Table 3.

TABLE 3

| Separated/Integrated | signal electrode separated in electric bonding area and actuator area | signal electrode integrated in electric bonding area and actuator area |
| --- | --- | --- |
| Average Temperature Increase in Actuator Elements after 10 seconds | 5° C. | 4° C. |
| Displacement of 0.2 µm or more | 100 | 26 |
| Average Temperature Increase in Actuator Elements after 1 hour | 6° C. | 4° C. |
| Displacement of 0.2 µm or more | 100 | 26 |
| Electric Conduction | ○ | ○ |

As in Table 3, in the actuator of this example in which the layer constitution of the signal electrode in the electric bonding area is differentiated from that in the actuator area, the number of the actuator elements having a displacement of 0.2 µm or more after driven for 1 hour is 100, and electric conduction is seen therein. However, in the comparative actuator in which the layer constitution of the signal electrode is the same both in the electric bonding area and in the actuator area, the number of the actuator elements having a displacement of 0.2 µm or more after driven for 1 hour is 26, though electric conduction is also seen therein.

After driven for 1 hour, the actuator of this example still shows stable displacement. The actuator elements, the bumps, the substrate and the interconnections of the actuator thus driven are observed, and neither bump breakage nor wire breakage is seen therein. However, some abnormal displacement is seen in the comparative actuator in which the layer constitution of the signal electrode is the same both in the electric bonding area and in the actuator area. This will be because the bump solder has too much wetted and overspread the signal electrode of each actuator element in the comparative actuator.

The test data confirm that the specific electrode constitution of the actuator of this example enables stable displacement action of each actuator element. Accordingly, these confirm the practicability of the actuator of this example.

EXAMPLE 5

With reference to FIG. 7 to FIG. 11 and FIG. 14, this is to demonstrate still another example of the circuit board-integrated matrix-arrayed piezoelectric actuator of the invention.

Figure 14:
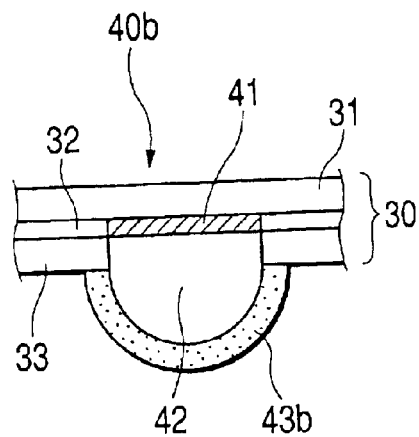
FIG. 14 is a cross-sectional view showing the constitution of the bumps in the circuit board-integrated matrix-arrayed piezoelectric actuator of Example 5 of the invention.

FIG. 14 is a cross-sectional view showing the constitution of the bumps in the circuit board-integrated matrix-arrayed piezoelectric actuator of Example 5 of the invention.

The constitution of the actuator of this example is almost the same as that of the actuator of Example 2 mentioned above. In this example, however, the material of the bump sealant differs from that in Example 2, as in FIG. 14. Precisely, in Example 5, semi-spherical bumps 40b are formed on the electric bonding pads 41 that are formed in the flexible printed circuit board 30 to correspond to the array of the signal electrodes 12. A core 42 of Cu is plated on each pad 41 through electrolytic plating, and this is coated with a sealant 43b of anisotropic conductive resin to form the semi-spherical bump 40b.

The overall constitution of the actuator of this example is the same as that of the actuator of Example 2, and its description is omitted herein.

With reference to FIGS. 7 to 11 and FIG. 14, the constitutive components of the circuit board-integrated matrix-arrayed piezoelectric actuator of this example are described.

The flexible printed circuit board 30 has a three-layered structure composed of a base film 31, a wiring pattern 32 and a cover lay 33, and 100 bumps 40b are formed thereon, each corresponding to the signal electrode 12 of every tabular piezoelectric actuator element 10 that will be mentioned hereinunder. The ratio of the height of Cu to the thickness of the anisotropic conductive resin in the bumps 40b is 5/1, and the height of the bumps 40b falls between 5 and 100 μm. Regarding the materials to constitute the flexible printed circuit board 30, the base film 31 is made of polyimide, having a thickness of 25 μm; the wiring pattern 32 is made of Cu, having a thickness of 9 μm; and the cover lay 33 is made of polyimide, having a thickness of 12.5 μm. The electric bonding pads 41 are circular, each having a diameter φ of 150 μm. Corresponding to them, the wiring pattern 32 has 100 lines formed at a pitch of 50 μm.

The tabular piezoelectric actuator elements 10 are made of a piezoelectric material. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. Both the common electrode 11 and the signal electrode 12 are formed according to a thin-film forming method of sputtering or plating.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. Concretely, the substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 μm thick. Next, 100 tabular piezoelectric actuator elements 10 of rectangular pieces of 0.5 mm×1 mm×0.05 mm (thickness) are prepared as in the above, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding bumps 40b formed on the flexible printed circuit board 30 in the previous step, and these are heated under pressure to thereby electrically bond the signal electrodes 12 to the corresponding bumps 40b. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 5, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 μm-thick, windowless thin stainless sheet 22 is measured through the windows of the windowed thin stainless sheet 23. In addition, the temperature of the surface of the flexible printed circuit board 30 is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10. The test data are given in Table 4.

TABLE 4

| Height of Bumps | 5 μm | 10 μm | 50 μm | 100 μm |
|---|---|---|---|---|
| Average Temperature Increase in Actuator Elements after 10 seconds | 142° C. | 31° C. | 12° C. | 11° C. |
| Displacement of 0.2 μm or more | 15 | 100 | 100 | 100 |
| Average Temperature Increase in Actuator Elements after 1 hour | 0° C. | 33° C. | 20° C. | 14° C. |
| Displacement of 0.2 μm or more | 0 | 100 | 100 | 100 |
| Electric Conduction | x | ○ | ○ | ○ |

As in Table 4, in the actuator having a bump height of 5 μm, the number of the actuator elements having a displacement of 0.2 μm or more after driven for 1 hour is 0, and no electric conduction is seen therein. However, in the other actuators of this example having a bump height of 10 μm or more, the number of the actuator elements having a displacement of 0.2 μm or more is 100, and electric conduction is seen therein.

In the actuator having a bump height of 5 μm, the actuator elements, the bumps, the substrate and the interconnections are observed after driven for 1 hour. In this, some bumps are broken and some wiring lines are cut. However, in the other actuators of this example having a bump height of 10 μm or more, nothing is broken.

The flexible printed circuit board-integrated actuators of this example having a bump height of 10 μm or more suffer little temperature increase and ensure good electric isolation. In these, in addition, every actuator element shows stable displacement. These confirm the practicability of the actuators of this example.

As in the above, Example 5 demonstrates the advantages of the invention, like Example 2.

EXAMPLE 6

With reference to FIG. 7 to FIG. 11 and FIG. 15, this is to demonstrate still another example of the circuit board-integrated matrix-arrayed piezoelectric actuator of the invention.

Figure 15:
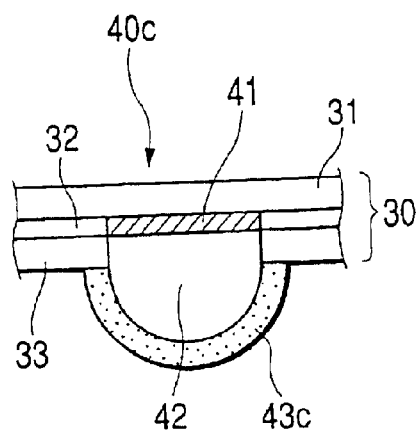
FIG. 15 is a cross-sectional view showing the constitution of the bumps in the circuit board-integrated matrix-arrayed piezoelectric actuator of Example 6 of the invention.

FIG. 15 is a cross-sectional view showing the constitution of the bumps in the circuit board-integrated matrix-arrayed piezoelectric actuator of Example 6 of the invention.

The constitution of the actuator of this example is almost the same as that of the actuator of Example 2 mentioned above. In this example, however, the material of the bump sealant differs from that in Example 2, as in FIG. 15. Precisely, in Example 6, semi-spherical bumps 40c are formed on the electric bonding pads 41 that are formed in the flexible printed circuit board 30 to correspond to the array of the signal electrodes 12. A core 42 of Cu is plated on each pad 41 through electrolytic plating, and this is plated with a sealant 43c of Au to form the semi-spherical bump 40c.

The overall constitution of the actuator of this example is the same as that of the actuator of Example 2, and its description is omitted herein.

With reference to FIGS. 7 to 11 and FIG. 15, the constitutive components of the circuit board-integrated matrix-arrayed piezoelectric actuator of this example are described.

The flexible printed circuit board 30 has a three-layered structure composed of a base film 31, a wiring pattern 32 and a cover lay 33, and 100 bumps 40c are formed thereon, each corresponding to the signal electrode 12 of every tabular piezoelectric actuator element 10 that will be mentioned hereinunder. The core 42 of each bump 40c is Cu, and the thickness of the sealant 43c to cover the core 42 is 1 μm. The height of the bumps 40c falls between 5 and 100 μm. Regarding the materials to constitute the flexible printed circuit board 30, the base film 31 is made of polyimide, having a thickness of 25 μm; the wiring pattern 32 is made of Cu, having a thickness of 9 μm; and the cover lay 33 is made of polyimide, having a thickness of 12.5 μm. The electric bonding pads 41 are circular, each having a diameter φ of 150 μm. Corresponding to them, the wiring pattern 32 has 100 lines formed at a pitch of 50 μm. For comparison, circular electric bonding pads 41 of 150 μmφ are formed on an alumina substrate having a thickness of 100 μm, and, corresponding to them, a Cu wiring pattern 32 of 100 lines is formed thereon at a pitch of 50 μm.

The tabular piezoelectric actuator elements 10 are made of a piezoelectric material. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. Both the common electrode 11 and the signal electrode 12 are formed according to a thin-film forming method of sputtering or plating.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. Concretely, the substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 µm thick. Next, 100 tabular piezoelectric actuator elements 10 of rectangular pieces of 0.5 mm×1 mm×0.05 mm (thickness) are prepared as in the above, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding bumps 40c formed on the flexible printed circuit board 30 in the previous step, and these are heated under pressure to thereby electrically bond the signal electrodes 12 to the corresponding bumps 40c. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 6, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 µm-thick, windowless thin stainless sheet 22 is measured through the windows of the windowed thin stainless sheet 23. In addition, the temperature of the surface of the flexible printed circuit board 30 is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10.

The test data are given in Table 5.

TABLE 5

| Height of Bumps | 5 µm | 10 µm | 50 µm | 100 µm |
|---|---|---|---|---|
| Average Temperature Increase in Actuator Elements after 10 seconds | 135° C. | 28° C. | 17° C. | 13° C. |
| Displacement of 0.2 µm or more | 15 | 100 | 100 | 100 |
| Average Temperature Increase in Actuator Elements after 1 hour | 0° C. | 38° C. | 19° C. | 18° C. |
| Displacement of 0.2 µm or more | 0 | 100 | 100 | 100 |
| Electric Conduction | x | ○ | ○ | ○ |

As in Table 5, in the actuator having a bump height of 5 µm, the number of the actuator elements having a displacement of 0.2 µm or more after driven for 1 hour is 0. However, in the other actuators of this example having a bump height of 10 µm or more, the number of the actuator elements having a displacement of 0.2 µm or more is 100.

In the actuator having a bump height of 5 µm, the actuator elements, the bumps, the substrate and the interconnections are observed after driven for 1 hour. In this, some bumps are broken and some wiring lines are cut. However, in the other actuators of this example having a bump height of 10 µm or more, nothing is broken.

The flexible printed circuit board-integrated actuators of this example having a bump height of 10 µm or more suffer little temperature increase and ensure good electric isolation. In these, in addition, every actuator element shows stable displacement. These confirm the practicability of the actuators of this example.

As in the above, Example 6 demonstrates the advantages of the invention, like Example 2.

EXAMPLE 7

With reference to FIG. 7 to FIG. 11 and FIG. 16, this is to demonstrate still another example of the circuit board-integrated matrix-arrayed piezoelectric actuator of the invention.

Figure 16:
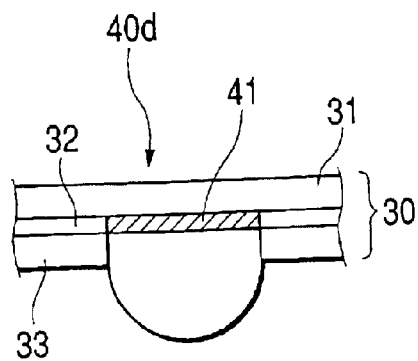
FIG. 16 is a cross-sectional view showing the constitution of the bumps in the circuit board-integrated matrix-arrayed piezoelectric actuator of Example 7 of the invention.

FIG. 16 is a cross-sectional view showing the constitution of the bumps in the circuit board-integrated matrix-arrayed piezoelectric actuator of Example 7 of the invention.

The constitution of the actuator of this example is almost the same as that of the actuator of Example 2 mentioned above, but the two differ in that the core 42 and the sealant 43 of the bumps in this example are made of the same material. Precisely, in Example 7, semi-spherical solder is formed through electrolytic plating on each of the electric bonding pads 41 that are formed in the flexible printed circuit board 30 to correspond to the array of the signal electrodes 12. Thus formed, the semi-spherical solder serves as the bumps 40d, or that is, solder alone forms both the core and the sealant of the bumps 40d in Example 7.

The overall constitution of the actuator of this example is the same as that of the actuator of Example 2, and its description is omitted herein.

With reference to FIGS. 7 to 11 and FIG. 16, the constitutive components of the circuit board-integrated matrix-arrayed piezoelectric actuator of this example are described.

The flexible printed circuit board 30 has a three-layered structure composed of a base film 31, a wiring pattern 32 and a cover lay 33, and hundred bumps 40d (solder) are formed thereon, each corresponding to the signal electrode 12 of every tabular piezoelectric actuator element 10 that will be mentioned hereinunder. The height of the bumps 40d falls between 5 and 100 µm. Regarding the materials to constitute the flexible printed circuit board 30, the base film 31 is made of polyimide, having a thickness of 25 µm; the wiring pattern 32 is made of Cu, having a thickness of 9 µm; and the cover lay 33 is made of polyimide, having a thickness of 12.5 µm. The electric bonding pads 41 are circular, each having a diameter φ of 150 µm. Corresponding to them, the wiring pattern 32 has 100 lines formed at a pitch of 50 μm. For comparison, circular electric bonding pads 41 of 150 μmφ are formed on an alumina substrate having a thickness of 100 μm, and, corresponding to them, a Cu wiring pattern 32 of 100 lines is formed thereon at a pitch of 50 μm.

The tabular piezoelectric actuator elements 10 are made of a piezoelectric material. For the piezoelectric material, used is a ceramic, lead zirconate titanate, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, or that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. Both the common electrode 11 and the signal electrode 12 are formed according to a thin-film forming method of sputtering or plating.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. Concretely, the substrate is formed as follows: A windowed thin stainless sheet 23 of 0.1 mm thick, which has 100 windows of 0.5 mm×0.5 mm each and in which the windows are arrayed to be spaced from each other by a distance of 0.2 mm between them, is bonded to a windowless thin stainless sheet 22 of 0.05 mm thick via an epoxy adhesive layer of 5 μm thick. Next, 100 tabular piezoelectric actuator elements 10 of rectangular pieces of 0.5 mm×1 mm×0.05 mm (thickness) are prepared as in the above, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22.

Now referred to are FIG. 7 and FIG. 8 to describe the method of bonding the tabular piezoelectric actuator elements formed on the substrate to the bumps formed on the flexible printed circuit board 30.

The signal electrodes 12 formed on the tabular piezoelectric actuator elements 10 are made to face the corresponding bumps 40d formed on the flexible printed circuit board 30 in the previous step, and these are heated under pressure to thereby electrically bond the signal electrodes 12 to the corresponding bumps 40d. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the bump 40d, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 7, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 50 kHz, and all the tabular piezoelectric actuator elements 10 are thus driven. Thus driven, the actuator is evaluated as follows: After 10 seconds and after 1 hour, the maximum displacement of each tabular piezoelectric actuator element 10 bonded to the 50 μm-thick, windowless thin stainless sheet 22 is measured through the windows of the windowed thin stainless sheet 23. In addition, the temperature of the surface of the flexible printed circuit board 30 is measured with a pyroelectric thermometer to determine the temperature increase in the actuator. Further, the electrostatic capacity of every tabular piezoelectric actuator element 10 is measured, and this is compared with the initial value thereof to confirm the electric conduction through the actuator elements 10.

The test data are given in Table 6.

TABLE 6

| | 5 μm | 10 μm | 50 μm | 100 μm |
|---|---|---|---|---|
| Height of Bumps | | | | |
| Average Temperature Increase in Actuator Elements after 10 seconds | 147° C. | 33° C. | 15° C. | 10° C. |
| Displacement of 0.2 μm or more | 15 | 100 | 100 | 100 |
| Average Temperature Increase in Actuator Elements after 1 hour | 0° C. | 40° C. | 21° C. | 15° C. |
| Displacement of 0.2 μm or more | 0 | 100 | 100 | 100 |
| Electric Conduction | x | ○ | ○ | ○ |

As in Table 6, in the actuator having a bump height of 5 μm, the number of the actuator elements having a displacement of 0.2 μm or more after driven for 1 hour is 0, and no electric conduction is seen therein. However, in the other actuators of this example having a bump height of 10 μm or more, the number of the actuator elements having a displacement of 0.2 μm or more is 100, and electric conduction is seen therein.

In the actuator having a bump height of 5 μm, the actuator elements, the bumps, the substrate and the interconnections are observed after driven for 1 hour. In this, some bumps are broken and some wiring lines are cut. However, in the other actuators of this example having a bump height of 10 μm or more, nothing is broken.

The flexible printed circuit board-integrated actuators of this example having a bump height of 10 μm or more suffer little temperature increase and ensure good electric isolation. In these, in addition, every actuator element shows stable displacement. These confirm the practicability of the actuators of this example.

As in the above, Example 7 demonstrates the advantages of the invention, like Example 2.

EXAMPLE 8

With reference to FIG. 7 to FIG. 11, FIG. 17 and FIG. 18, still another example of the circuit board-integrated matrix-arrayed piezoelectric actuator of the invention will be described.

Figure 17:
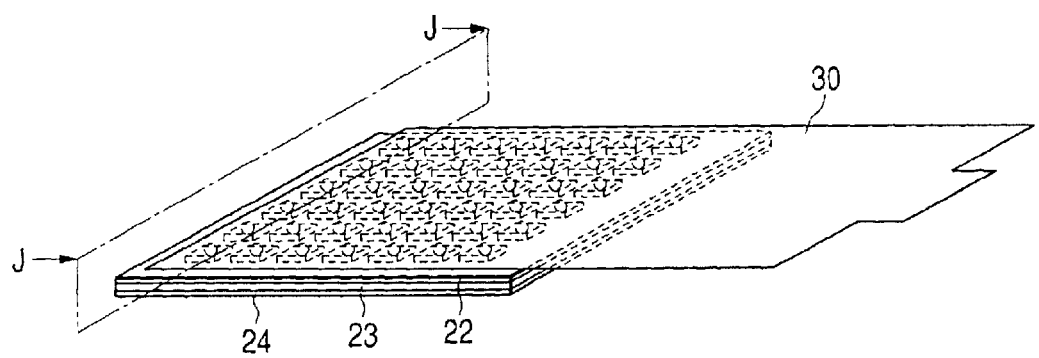
FIG. 17 is a perspective view showing the overall constitution of the circuit board-integrated matrix-arrayed piezoelectric actuator of Example 8 of the invention.
Figure 18:
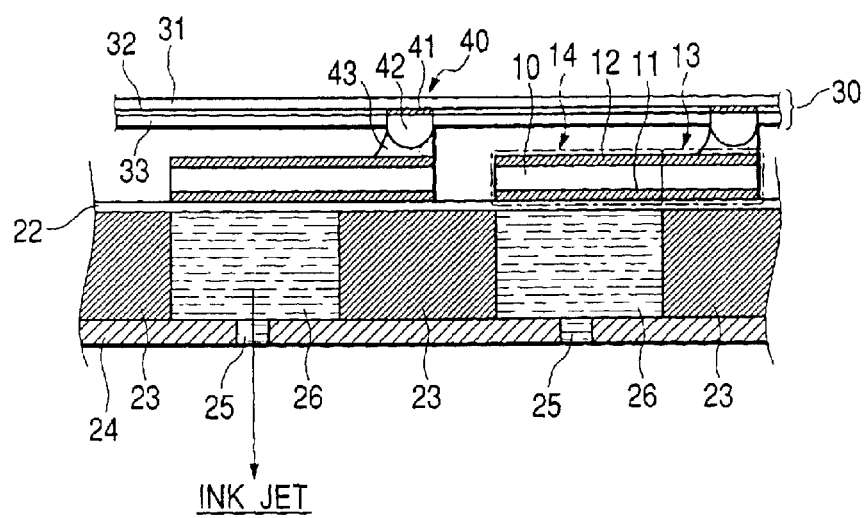
FIG. 18 is a J—J cross-sectional view of FIG. 17.
Figure 19:
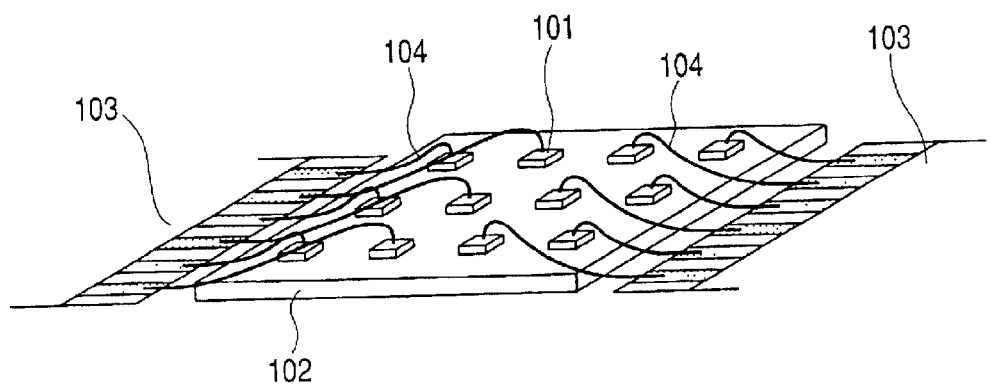
FIG. 19 is a perspective view showing the constitution of a matrix-arrayed piezoelectric actuator of the related art 1.
Figure 20:
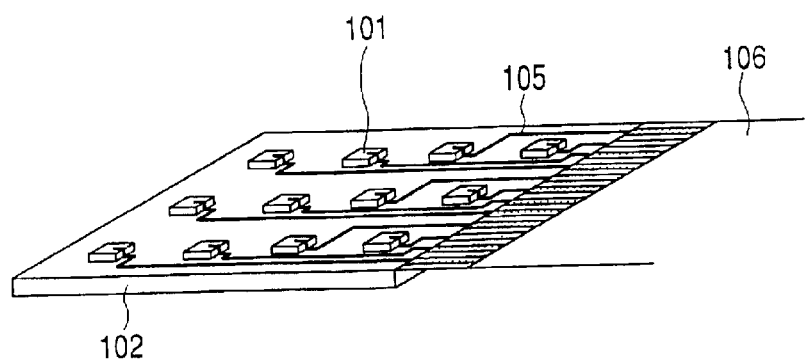
FIG. 20 is a perspective view showing the constitution of a matrix-arrayed piezoelectric actuator of the related art 2.

FIG. 17 is a perspective view showing the overall constitution of the circuit board-integrated matrix-arrayed piezoelectric actuator of Example 8 of the invention. FIG. 18 is a J—J cross-sectional view of FIG. 17.

The constitution of the actuator of this example is almost the same as that of the actuator of Example 2 mentioned above, but the two differ in point of the substrate constitution. Precisely, in Example 8, the substrate has a polyimide film 24 in addition to the windowed thin stainless sheet and the windowless thin stainless sheet, as in FIG. 17 and FIG. 18.

The overall constitution of the actuator of this example is the same as that of the actuator of Example 2, and its description is omitted herein.

With reference to FIGS. 7 to 11, and FIGS. 17 and 18, the constitutive components of the circuit board-integrated matrix-arrayed piezoelectric actuator of this example are described.

The flexible printed circuit board 30 has a three-layered structure including a base film 31, a wiring pattern 32 and a cover lay 33. Electric bonding pads 41 correspond to the array of signal electrodes 12 on the tabular piezoelectric actuator elements 10. On each pad 41, formed is a semi-spherical core 42 of Cu through electrolytic plating. The core 42 is coated with solder 43 also through electrolytic plating to form semi-spherical bumps 40. It is generally known that Cu has a Young's modulus of $112.5 \times 10^5$ (kg/cm$^2$). In addition, Cu is extremely soft, and the core 42 of Cu can readily absorb the height difference between the individual bumps 40 as it deforms by itself in the heating and pressing process to be mentioned hereinunder. However, since Cu and solder readily form a brittle alloy layer while stored on any ordinary condition, a stopper layer of Ni is formed in the interface between Cu and solder in this example. Other than Cu, Ni may be also employable for the core 42. The thickness of the solder plate layer is at least 5 $\mu$m. This is because the thickness of the solder plate layer has a close correlation with the wet spreading diameter of the solder heated in the heating and pressing process to be mentioned hereinunder. If the thickness of the solder plate layer is smaller than 5 $\mu$m, the mechanical bonding strength of the solder to the tabular piezoelectric actuator elements 10 is lowered, and the reliability of the fabricated actuator of this example is thereby lowered. In this example, the ratio of the height of Cu to the thickness of solder is 5/1, and hundred bumps 40 each having a height of from 5 $\mu$m to 10 $\mu$m are formed on the flexible printed circuit board 30 each in the position corresponding to the signal electrode 12 of every tabular piezoelectric actuator element 10 that will be mentioned hereinunder. Regarding the materials to constitute the flexible printed circuit board 30, the base film 31 is made of polyimide, having a thickness of 25 $\mu$m; the wiring pattern 32 is made of Cu, having a thickness of 9 $\mu$m; and the cover lay 33 is made of polyimide, having a thickness of 12.5 $\mu$m. The electric bonding pads 41 are circular, each having a diameter $\phi$ of 150 $\mu$m. Corresponding to them, the wiring pattern 32 has hundred lines formed at a pitch of 50 $\mu$m. For comparison, circular electric bonding pads 41 of 150 $\mu$m$\phi$ and bumps 40 of 10 $\mu$m high are formed on an alumina substrate having a thickness of 100 $\mu$m, and corresponding to them, a Cu wiring pattern 32 of hundred lines is formed at a pitch of 50 $\mu$m.

The tabular piezoelectric actuator elements 10 are made of a piezoelectric material. For the piezoelectric material, used is a lead zirconate titanate ceramic, and its sintered block is cut into rectangular pieces of 0.5 mm×1 mm×0.05 mm. Next, on both the major faces of every tabular piezoelectric actuator element 10 of the rectangular ceramic piece, formed are a common electrode 11 and a signal electrode 12. The common electrode 11 faces the substrate, and the signal electrode 12 is opposite to it. The common electrode 11 has a two-layered structure of a first layer 111 of Cr and a second layer 112 of Au. The reason why Cr is selected for the first layer 111 is because it compensates for the poor adhesiveness of Au to the tabular piezoelectric actuator elements 10. The Au layer has a thickness of at least 50 nm for preventing Cr oxidation, that is, for ensuring the electromechanical reliability of the actuator fabricated herein. The signal electrode 12 has a three-layered structure of a first layer 121 of Cr, a second layer 122 of Ni and a third layer 123 of Au. The reason why Cr is selected for the first layer 121 is because it compensates for the poor adhesiveness of Ni to the tabular piezoelectric actuator elements 10. In view of the thickness of the electrode, the Ni layer must have a thickness of at least 500 nm. This is for preventing the Ni loss that may be caused by the formation of an alloy layer of Ni and solder in the heating and pressing process to be mentioned hereinunder or after the constitutive components have aged and degraded. If Ni is lost, the solder of the bumps 40 will be in direct contact with the Cr layer of the signal electrode 12. If so, since Cr does not form an alloy layer with solder, the mechanical bonding strength of the tabular piezoelectric actuator elements 10 to the flexible printed circuit board 30 noticeably lowers and, as a result, the reliability of the fabricated actuator will be thereby lowered. In this example, the thickness of the Ni layer is 600 nm. Au is formed for ensuring the solder wettability, and the thickness of its layer is at least 50 nm. Both the common electrode 11 and the signal electrode 12 are formed according to a thin-film forming method of sputtering or plating.

Like in Example 2, the substrate is formed of a windowless thin stainless sheet 22 and a windowed thin stainless sheet 23. The common electrode 11 of every tabular piezoelectric actuator element 10 is electromechanically bonded to the windowless thin stainless sheet 22 with an epoxy resin adhesive that ensures electric conduction between the tabular piezoelectric actuator elements 10 and the windowless thin stainless sheet 22. To bond the windowless thin stainless sheet 22 to the windowed thin stainless sheet 23, and to bond the windowed thin stainless sheet 23 to the polyimide resin film 24, also used is such an epoxy resin adhesive. Concretely, the substrate is formed as follows: A windowed thin stainless sheet 23 of 0.1 mm thick, which each has hundred windows of 0.5 mm×0.5 mm and in which the windows are arrayed to be spaced from each other by a distance of 0.2 mm between them, is bonded to a windowless thin stainless sheet 22 of 0.05 mm thick via an epoxy adhesive layer of 5 $\mu$m thick. Next, hundred tabular piezoelectric actuator elements 10 of rectangular pieces of 0.5 mm×1 mm×0.05 mm (thickness) are prepared as in the above, and these are bonded to the 0.05 mm-thick windowless thin stainless sheet 22 to form a matrix array thereon, using an epoxy adhesive. In this stage, the two edges of each tabular piezoelectric actuator element 10 are made to correspond to the two edges of each window of the windowed thin stainless sheet 23. In that condition, therefore, the common electrode 11 and the signal electrode 12 are separately formed on any of the two opposite faces of every matrix-arrayed tabular piezoelectric actuator element 10, and the common electrode 11 of every actuator element 10 is electrically connected with the windowless thin stainless sheet 22. Next, a polyimide resin film of 50 μm thick is bonded to the outer face of the 0.1 mm-thick, windowed thin stainless sheet 23 opposite to the actuator elements 10 bonded thereto, using an epoxy adhesive. Through-holes 25 of 30 μmφ are holed in the polyimide film 24, which one-to-one correspond to hundred windows (0.5 mm×0.5 mm each) of the windowed thin stainless sheet 23. With that, hundred windows (0.5 mm×0.5 mm each) of the windowed thin stainless sheet 23 that are individually surrounded by the 0.05 mm-thick windowless thin stainless sheet 22 and the polyimide film 24 are filled with liquid ink 26.

Now referred to are FIG. 7 and FIG. 8 to describe the method of bonding the tabular piezoelectric actuator elements formed on the substrate to the bumps formed on the flexible printed circuit board.

The signal electrodes 12 formed on the tabular piezoelectric actuator elements 10 are made to face the corresponding bumps 40 formed on the flexible printed circuit board 30 in the previous step, and these are heated under pressure to thereby electrically bond the signal electrodes 12 to the corresponding bumps 40. In this stage, since the wiring pattern of the flexible printed circuit board 30 is above the tabular piezoelectric actuator elements 10, the packaging density of the flexible printed circuit board 30 is increased to the highest degree. In addition, there exists a gap formed by the core 42, between every tabular piezoelectric actuator element 10 and the flexible printed circuit board 30, and therefore the actuator area 14 of the signal electrode 12 of each tabular piezoelectric actuator element 10 is allowed to act free, not interfered with any other.

The circuit board-integrated matrix-arrayed piezoelectric actuator of Example 8, thus fabricated as herein, is tested to evaluate it according to the test method mentioned below.

First, a direct current of 50 V is applied to the actuator for polarization. For driving the actuator, a direct current of 25 V is applied on the bias to every tabular piezoelectric actuator element 10 to make it receive a voltage of 25 V at a frequency of 10 kHz, and all the tabular piezoelectric actuator elements 10 are thus driven. Thus driven continuously for 10 seconds and for 1 hour, the actuator is evaluated as follows: After 10 seconds and after 1 hour, the volume of the ink jet and the ink jet speed are measured. The ink jet volume stability is determined by measuring the diameter of the ink jet given to a recording sheet disposed opposite to and in parallel to the polyimide film 24 of the actuator tested.

The test data are given in Table 7.

TABLE 7

| Height of Bumps | 5 μm | 10 μm | 10 μm (on alumina substrate) |
|---|---|---|---|
| Diameter of Ink Jet after 10 seconds | 60 μm (not all but some samples only) | 85 μm | no ink jet found |
| Diameter of Ink Jet after 1 hour | no ink jet found | 84 μm | no ink jet found |
| Ink Jet Speed after 10 seconds | 6.5 m/sec (not all but some samples only) | 9.5 m/sec | no ink jet found |
| Ink Jet Speed after 1 hour | no ink jet found | 9.3 m/sec | no ink jet found |

As in Table 7, the actuator of this example having a bump height of 5 μm and the comparative actuator having an alumina substrate and having a bump height of 10 μm give no ink jet, after driven for 1 hour. However, the actuator of this example having a bump height of 10 μm gives an ink jet, and its diameter is 84 μm and its speed is 9.3 m/sec, after driven for 1 hour.

After driven for 1 hour, the actuator elements, the bumps, the substrate and the interconnections of the actuators are observed. In the actuator of this example having a bump height of 5 μm, some bumps are broken and some wiring lines are cut, and, as a result, no ink jet from it is found. However, the actuator of this example having a bump height of 10 μm gives a stable ink jet with no fluctuation in the ink jet volume and in the ink jet speed. In the comparative actuator having an alumina substrate, the substrate is warped and the bump height therefore fluctuates. As a result, the comparative actuator suffers bump-actuator element bonding failure, substrate breakage and interconnection breakage.

The test data confirm that the flexible printed circuit board-integrated actuator of this example having a bump height of 10 μm or more is applicable to inkjet devices for inkjet recording heads.

The invention has been described in detail with reference to its drawings attached hereto, but the invention should not be limited to its specific embodiments concretely disclosed herein. Not overstepping the spirit and the scope thereof, the invention encompasses various changes and modifications thereof.

For example, the circuit board in all the examples mentioned above is the flexible printed circuit board 30, which, however, is not limitative. In the invention, any other circuit board is employable.

In the examples mentioned above, used are matrix-arrayed multiple tabular piezoelectric actuator elements 10, which, however, are not also limitative. Apart from these, any other modifications of actuator element arrays are employable in the invention. For example, the matrix array of N tabular piezoelectric actuator elements 10 in P rows×Q columns (N, P and Q are natural numbers of at least 2, and N=P×Q) may be modified into any others in which the outermost row has (Q−n) columns or the outermost column has (P−m) rows (n and m are natural numbers), and any and every such modification is employable in the invention.

In the examples, a common electrode 11 and a signal electrode 12 are formed on the two major faces of each tabular piezoelectric actuator element 10, and the common electrode 11 faces the substrate and the signal electrode 12 is opposite to it. However, this is not also limitative. Contrary to this, the signal electrode 12 may face the substrate with the common electrode 11 opposite to it.

In the examples, the common electrode 11 of each tabular piezoelectric actuator element 10 is single-layered or two-layered, which, however, is not also limitative. If desired, the common electrode 11 may have a multiple-layered structure of further more layers.

In the examples, the signal electrode 12 of each tabular piezoelectric actuator element 10 is single-layered or three-layered, which, however, is not also limitative. The signal electrode 12 may have a multiple-layered structure of further more layers.

In the examples, the first layer 111 of the common electrode 11 that is kept in contact with each tabular piezoelectric actuator element 10 is made of Cr, which, however, is not also limitative. If possible, any other material is used for the first layer 111.

In the examples, the second layer 112 of the common electrode 11 that is kept in contact with the substrate 20 is made of Au, which, however, is not also limitative. If possible, any other material is used for the second layer 112.

In the examples, the first layer 121 of the signal electrode 12 that is kept in contact with each tabular piezoelectric actuator element 10 is made of Cr, which, however, is not also limitative. If possible, any other material is used for the first layer 121.

In the examples, the second interlayer 122 of the signal electrode 12 is made of Ni, which, however, is not also limitative. If possible, any other material is used for the second layer 122.

In the examples, the third layer of the signal electrode that is kept in contact with each bump 40 is made of Au, which, however, is not also limitative. If possible, any other material is used for the third layer.

In the examples, each tabular piezoelectric actuator element 10, the common electrode 11 and the signal electrode 12 are to have an electric bonding area 13 in which each actuator element is bonded to the corresponding bump 40, and an actuator area 14 that acts to drive the tabular piezoelectric actuator elements 10. However, this constitution is not limitative. Provided that the actuator elements 10 can be bonded to the corresponding bumps 40 and that the tabular piezoelectric actuator elements 10 can be driven in the modified constitution, the components are not always required to be divided into such sections, or they may be divided into any other multiple functional sections.

In the examples, epoxy resin is used for bonding the tabular piezoelectric actuator elements 10 to the windowless thin stainless sheet 22, which, however, is not also limitative. Provided that it ensures electric conduction, any other adhesive is also employable in the invention.

In the examples, the spherical core 44 is made of Cu, which, however, is not also limitative. Ni and Ag are also employable in addition to it.

In the examples, the cores 42 are provided in the flexible printed circuit board 30, which, however, is not also limitative. A core may be mounted on each tabular piezoelectric actuator element 10 in the electric bonding area 13 thereof, and the intended bumps may be formed by heating and melting solder around the cores.

In the examples, the conductive core 42 of each bump 40 is semi-spherical or spherical, which, however, is not also limitative. Provided that it functions as a core, it may have any other form.

In the examples, the conductive core 42 is made of inorganic material such as metal or ceramic or is made of solder material. If possible, however, any other material is employable for it.

In the examples, the conductive sealant 43 is made of metal, anisotropic resin or solder material. Apart from these, however, epoxy resin is also employable. If possible, in addition, any other material is also employable.

In the examples, the conductive core 42 and the conductive sealant 43 are both solder to form the bumps 40d, which, however, is not limitative. Any other material than solder, for example, Au is also employable to form them.

In the examples, stainless sheets are used for the substrate, but are not limitative. Apart from these, Ni, covar and the like are also employable for it. In addition, Ni-coated organic resin films are also employable.

In the examples, the bumps 40 on the flexible printed circuit board 30 are electrically bonded to each signal electrode 11 by heating, pressing or vibrating them, which, however, is not also limitative. If possible, their bonding may be effected in any other process not including heating, pressing and vibrating.

In the examples, the lattice array-structured piezoelectric actuator elements 10 are applied to inkjet devices for inkjet recording heads. Not limited thereto, however, they are also applicable to any other various devices such as optical switches, optical phase-change devices, etc.

As described in detail hereinabove with reference to its preferred embodiments, the advantages of the constitution of invention are that any superfluous wiring and bonding process can be omitted, the packaging density of flexible printed circuits can be increased to the highest degree, and high-density electric bonding of matrix-arrayed multiple tabular piezoelectric actuator elements on a substrate can be readily attained at low costs.

One reason for it is because the invention enables thermal or pressure electric bonding of matrix-arrayed tabular piezoelectric actuator elements to semi-spherical bumps formed on electric bonding pads that are correspondingly arrayed in a flexible printed circuit board, requiring neither a system of multiple terminal bonding as in the related art 1 in which every tabular piezoelectric actuator element is electrically bonded one after one to a circuit board in a mode of wire bonding, nor a system of once rearranging a matrix conductor pattern of multiple tabular piezoelectric actuator elements formed on a substrate into a one-dimensional array thereof through screen-printing and thereafter electrically bonding the thus-rearranged conductor pattern to a flexible printed circuit board as in the related art 2.

Another advantage of the constitution of the invention is that the productivity is increased and, in particular, the production costs are reduced.

One reason for it is because, in the invention, a rigid component is bonded to every tabular piezoelectric actuator element just below the electric bonding area of each actuator element. The rigid components prevent the flexural deformation and damage of the tabular piezoelectric actuator elements that may be caused by the stress concentration to occur under pressure in the tip of each bump on a flexible printed circuit board and in the electric bonding area of each tabular piezoelectric actuator element, and also prevent the electric bonding area itself from being vibrated, therefore preventing the electric interconnections from being damaged or broken by metal fatigue or the like.

Still another advantage of the constitution of the invention is that it efficiently utilizes the intrinsic characteristics of tabular piezoelectric actuator elements.

One reason for it is because, in the invention, there exists a gap formed by the core of each pump, between every tabular piezoelectric actuator element and a flexible printed circuit board, and therefore every tabular piezoelectric actuator element is allowed to act free, not interfered with any other.

Still another advantage of the constitution of the invention is that it ensures long-term reliability of all tabular piezoelectric actuator elements electrically bonded to a circuit board.

One reason for it is because, as so mentioned hereinabove in the invention, a rigid component is bonded to every tabular piezoelectric actuator element just below the electric bonding area of each actuator element. The rigid components prevent the damage or breakage of the piezoelectric actuator of the invention that may be caused by the stress concentration to occur under pressure in the tip of each semi-spherical bump on a flexible printed circuit board and in the electric bonding area of each tabular piezoelectric actuator element, and also prevent the electric bonding area itself from being vibrated, therefore preventing the electric interconnections from being damaged or broken by metal fatigue or the like.

Another reason is because the semi-spherical bumps used in the invention ensure their contact with tabular piezoelectric actuator elements. Even when a flexible printed circuit board meets tabular piezoelectric actuator elements at some angles (in the area around the shoulder of the contact region in which the circuit board meets each actuator element) and when the tabular piezoelectric actuator elements are made of a brittle material, the bumps well prevent the actuator elements from being damaged or broken in the heating/pressing process of fabricating the intended actuator.

Still another reason is because rigid circuit boards often cause bonding failure thereon as they readily warp. As opposed to them, the substrate of flexible printed circuit boards is made of flexible resin such as polyimide or the like. When the flexible printed circuit board of the type is pressed against actuator elements formed on a substrate by the use of a metallic tool of high surface smoothness, its flexible substrate can completely absorb the warping of the circuit board. In addition, the flexible printed circuit board can well follow the pitch change of matrix-arrayed multiple tabular piezoelectric actuator elements that may be caused by the ambient temperature change around them.

What is claimed is:

1. A lattice array-structured piezoelectric actuator comprising:
   a plurality of tabular piezoelectric actuator elements disposed on a substrate; and
   a flexible circuit board having a plurality of signal lines,
   wherein a surface electrode of each of piezoelectric actuator elements is electrically connected to a predetermined position on a corresponding one of the plurality of signal lines on the flexible circuit board; and
   wherein the surface electrode of each of piezoelectric actuator elements is electrically connected with the corresponding one of the plurality of signal lines on the flexible circuit board via a bump with a predetermined gap.

2. The lattice array-structured piezoelectric actuator according to claim 1, wherein the lattice array structure is a matrix array structure of the plurality of tabular piezoelectric actuator elements.

3. The lattice array-structured piezoelectric actuator according to claim 2,
   wherein the surface electrode of each of piezoelectric actuator elements is a signal electrode used to select the corresponding piezoelectric actuator element; and
   wherein each of piezoelectric actuator has a common electrode on an opposite surface thereof to a surface on which the signal electrode is formed.

4. The lattice array-structured piezoelectric actuator according to claim 3, wherein the tabular piezoelectric actuator elements, the common electrodes and the signal electrodes each have, on the same plane:
   an electric bonding area in which each of actuator elements is electrically bonded to the corresponding bump; and
   an actuator area in which each actuator element is driven except the electric bonding area.

5. The lattice array-structured piezoelectric actuator according to claim 4, wherein each of tabular piezoelectric actuator elements flexurally deforms in the actuator area to move in a thickness direction.

6. The lattice array-structured piezoelectric actuator according to claim 4, wherein the flexible circuit board has electric bonding pads for electrically bonding the bumps to the actuator elements in positions corresponding to the electric bonding areas of the actuator elements.

7. The lattice array-structured piezoelectric actuator according to claim 1, wherein the predetermined gap formed by the bumps between the tabular piezoelectric actuator elements and the flexible circuit board is not smaller than 10 $\mu$m.

8. The lattice array-structured piezoelectric actuator according to claim 1, further comprising a rigid component on the substrate just below a bonding area between each of bumps and each of surface electrodes.

9. The lattice array-structured piezoelectric actuator according to claim 8, wherein the substrate is formed of a windowless metal sheet and the rigid component is formed of a windowed metal sheet.

10. An ink droplet jetting head comprising a lattice array-structured piezoelectric actuator having:
    a plurality of tabular piezoelectric actuator elements disposed on a substrate; and
    a flexible circuit board having a plurality of signal lines,
    wherein a surface electrode of each of piezoelectric actuator elements is electrically connected to a predetermined position on a corresponding one of the plurality of signal lines on the flexible circuit board; and
    wherein the surface electrode of each of piezoelectric actuator elements is electrically connected with the corresponding one of the plurality of signal lines on the flexible circuit board via a bump with a predetermined gap.

11. The ink droplet jetting head according to claim 10, wherein the lattice array structure is a matrix array structure of the plurality of tabular piezoelectric actuator elements.

12. The ink droplet jetting head according to claim 11,
    wherein the surface electrode of each of piezoelectric actuator elements is a signal electrode used to select the corresponding piezoelectric actuator element; and
    wherein each of piezoelectric actuator has a common electrode on an opposite surface thereof to a surface on which the signal electrode is formed.

13. The ink droplet jetting head according to claim 12, wherein the tabular piezoelectric actuator elements, the common electrodes and the signal electrodes each have, on the same plane:
    an electric bonding area in which each of actuator elements is electrically bonded to the corresponding bump; and
    an actuator area in which each actuator element is driven except the electric bonding area.

14. The ink droplet jetting head according to claim 13, wherein each of tabular piezoelectric actuator elements flexurally deforms in the actuator area to move in a thickness direction.

15. The ink droplet jetting head according to according to claim 13, wherein the flexible circuit board has electric bonding pads for electrically bonding the bumps to the actuator elements in positions corresponding to the electric bonding areas of the actuator elements.

16. The ink droplet jetting head according to claim 10, wherein the predetermined gap formed by the bumps between the tabular piezoelectric actuator elements and the flexible circuit board is not smaller than 10 µm.

17. The ink droplet jetting head according to claim 10, wherein the lattice array-structured piezoelectric actuator further comprises a rigid component on the substrate just below a bonding area between each of bumps and each of surface electrodes.

18. The ink droplet jetting head according to claim 17, wherein the substrate is formed of a windowless metal sheet and the rigid component is formed of a windowed metal sheet.

* * * * *